(12) United States Patent
Chun

(10) Patent No.: US 9,251,866 B2
(45) Date of Patent: Feb. 2, 2016

(54) SEMICONDUCTOR MEMORY DEVICE AND BODY BIAS METHOD THEREOF

(71) Applicant: Kichul Chun, Seongnam-si (KR)

(72) Inventor: Kichul Chun, Seongnam-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 1 day.

(21) Appl. No.: 14/246,685

(22) Filed: Apr. 7, 2014

(65) Prior Publication Data

US 2014/0307513 A1    Oct. 16, 2014

(30) Foreign Application Priority Data

Apr. 15, 2013   (KR) .................. 10-2013-0041169

(51) Int. Cl.
| | |
|---|---|
| G11C 5/14 | (2006.01) |
| H03K 19/003 | (2006.01) |
| H03K 19/00 | (2006.01) |
| H01L 27/092 | (2006.01) |
| G05F 3/20 | (2006.01) |
| H02M 3/07 | (2006.01) |
| G11C 29/02 | (2006.01) |

(52) U.S. Cl.
CPC .............. *G11C 5/146* (2013.01); *G05F 3/205* (2013.01); *G11C 5/147* (2013.01); *H01L 27/092* (2013.01); *H02M 3/073* (2013.01); *H03K 19/0013* (2013.01); *H03K 19/0016* (2013.01); *H03K 19/00315* (2013.01); *G11C 29/021* (2013.01); *G11C 29/028* (2013.01)

(58) Field of Classification Search
CPC .. G11C 5/146; G11C 5/147; H03K 19/00315; H03K 19/0013; H03K 19/0016; H01L 27/092; G05F 3/205; H02M 3/073
See application file for complete search history.

(56) References Cited

U.S. PATENT DOCUMENTS

| | | | |
|---|---|---|---|
| 5,610,533 A * | 3/1997 | Arimoto et al. ................. 326/33 |
| 6,046,627 A * | 4/2000 | Itoh et al. ....................... 327/546 |
| 6,097,113 A * | 8/2000 | Teraoka et al. ................ 307/125 |
| 6,490,218 B1 | 12/2002 | Vyvoda et al. |
| 6,630,857 B2 * | 10/2003 | Mizuno et al. ................. 327/534 |
| 6,664,834 B2 | 12/2003 | Nair et al. |
| 6,686,790 B2 | 2/2004 | Cutter et al. |
| 6,809,948 B2 | 10/2004 | Nachumovsky et al. |
| 7,589,653 B2 | 9/2009 | Guedon et al. |
| 7,616,048 B2 | 11/2009 | Choi et al. |
| 7,683,682 B1 | 3/2010 | Won et al. |
| 7,714,601 B2 * | 5/2010 | Ito .............................. 324/762.01 |
| 7,952,950 B2 | 5/2011 | Miyatake et al. |
| 8,254,198 B2 | 8/2012 | Borot et al. |
| 8,416,011 B2 | 4/2013 | Chokka et al. |
| 2006/0132187 A1 | 6/2006 | Tschanz et al. |
| 2006/0132218 A1 | 6/2006 | Tschanz et al. |

\* cited by examiner

*Primary Examiner* — Vanthu Nguyen
(74) *Attorney, Agent, or Firm* — F. Chau & Associates, LLC

(57) ABSTRACT

A semiconductor memory device is provided which includes a function block including a plurality of transistors; a body bias control unit configured to detect a command and to generate a body bias selection signal according to the detection result; and a body bias generator configured to generate a body voltage according to the body bias selection signal and to provide the body voltage to bodies of the plurality of transistors, wherein the body bias generator down-converts a power supply voltage supplied from an external device to generate the body voltage.

36 Claims, 17 Drawing Sheets

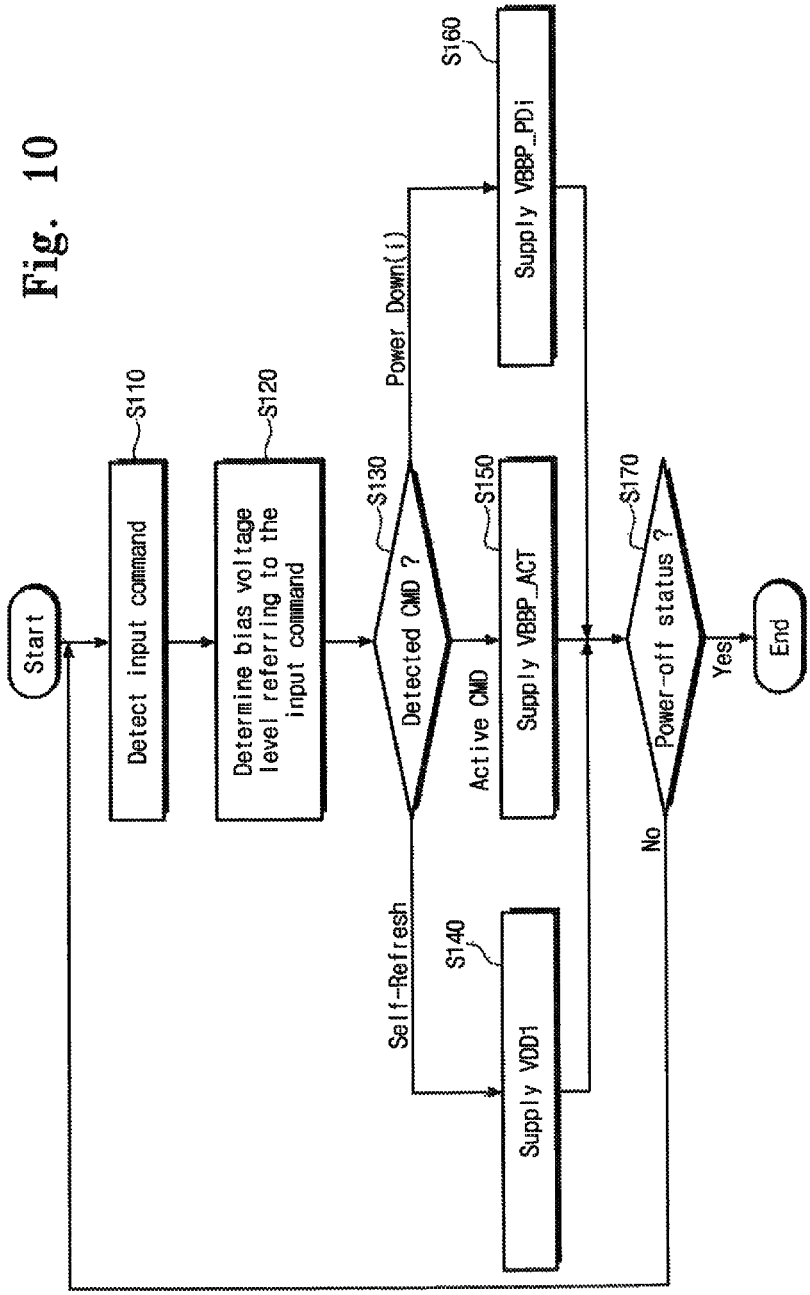

SEMICONDUCTOR MEMORY DEVICE AND BODY BIAS METHOD THEREOF

CROSS-REFERENCE TO RELATED APPLICATIONS

This application claims priority under 35 U.S.C. §119 to Patent Application No. 10-2013-0041169, filed on Apr. 15, 2013, in the Korean Intellectual Property Office, the entire contents of which are incorporated by reference herein.

TECHNICAL FIELD

The inventive concepts described herein relate to a semiconductor device, and more particularly, a semiconductor memory device capable of providing a body bias provided at a power-down mode differentially and a body bias control method thereof.

In recent years, the use of mobile devices such as a smart phone, a tablet PC, a digital camera, an MP3 player, a PDA, etc., has become significantly popular. As multimedia transmissions to and from mobile devices increase, increased processing and storage capabilities are needed. The mobile devices may employ high performance semiconductor devices including DRAMs, flash memories, application processors etc., to drive various application programs. With the ever increasing demand for higher performance mobile devices, efficient power management remains a major part of the product.

SUMMARY

One aspect of embodiments of the inventive concept is directed to provide a semiconductor memory device which comprises a function block including a plurality of transistors; a body bias control unit configured to detect a command and to generate a body bias selection signal according to the detection result; and a body bias generator configured to generate a body voltage according to the body bias selection signal and to provide the body voltage to bodies of the plurality of transistors, wherein the body bias generator down-converts a power supply voltage supplied from an external device to generate the body voltage.

Another aspect of the inventive concept is directed to provide a body bias method of a semiconductor memory device which comprises detecting a command of the semiconductor memory device; generating a reference voltage corresponding to a type of the command; down-converting a first power supply voltage provided from an external device or a second power supply voltage internally generated based on the reference voltage to generate a body voltage; and supplying the body voltage to bodies of transistors during an operating period corresponding to the command.

Still another aspect of the inventive concept is directed to provide a semiconductor memory device which provides a body voltage to bodies of transistors for a body bias. The semiconductor memory device comprises a reference generator configured to generate a reference voltage variable according to a mode of operation; a down converter configured to down-convert a power supply voltage provided from an external device according to the reference voltage and to provide the down-converted voltage as the body voltage; and an offset providing unit configured to provide an offset for adjusting the reference voltage to the reference generator.

With embodiments of the inventive concept, a body bias may be quickly stabilized, power down exit can be performed at high-speed, and power consumption may be reduced.

A semiconductor device is provided, comprising a memory device having a plurality of transistors supplied with a first power supply voltage; a body bias control unit configured to detect a command and to generate a body bias selection signal; and a body bias voltage generator supplied with a second power supply voltage, the body bias voltage generator configured to generate a plurality of body bias voltages to body bias the plurality of transistors according to the body bias selection signal, wherein the second power supply voltage is at a higher voltage level than the first power supply voltage.

According to an embodiment, the second power supply voltage level is the same as or higher than the generated body bias voltages.

According to an embodiment, the body bias voltage generator includes a voltage down converter to generate the plurality of body bias voltages.

According to an embodiment, the voltage down converter is supplied with both the first power supply voltage and the second power supply voltage.

According to an embodiment, the plurality of body bias voltages comprises at least three different voltage levels.

According to an embodiment, the command includes a power down mode and a self refresh mode, and the body bias voltage generated for the self refresh mode is higher than the body bias voltage level for the power down mode.

According to an embodiment, the command includes an active mode, a power down mode, and a self refresh mode, and the body bias voltage generated for the self refresh mode is equal to or lower than the second power supply voltage, and the body bias voltage generated for the active mode is less than the self refresh mode and the power down mode.

According to an embodiment, the body bias voltage generator includes a reference voltage generator configured to generate a plurality of reference voltages according to the body bias selection signal.

According to an embodiment, the reference voltage generator is configured to vary the reference voltages according to process, voltage, and temperature (PVT) variations.

According to an embodiment, the semiconductor device further includes a current leakage monitor configured to monitor the amount of leakage current flow of the plurality of transistors and provide an offset based on the monitored leakage current to the reference voltage generator.

According to an embodiment, the body bias voltage generator is configured to change the levels of body bias voltages in response to different operation mode commands, wherein the change in body bias voltages is accomplished within 200 ns.

According to an embodiment, the memory device is a DRAM.

According to an embodiment, the memory device is a nonvolatile memory device.

According to an embodiment, the body bias voltage generator is supplied with the first power supply voltage in addition to the second power supply voltage.

According to an embodiment, the body bias voltage generator includes at least one comparator having an output connected to a transistor which in turn provides a body bias voltage without use of any capacitor for energy storage or discharge.

A method of operating a semiconductor device is also provided, comprising supplying a plurality of transistors with a first power supply voltage; detecting a command to generate a body bias selection signal; and supplying a body bias voltage generator with a second power supply voltage and generating a plurality of body bias voltages to body bias the plurality of transistors according to the body bias selection signal.

According to an embodiment, the second power supply voltage is at a higher voltage level than the first power supply voltage.

According to an embodiment, the second power supply voltage level is the same as or higher than the generated body bias voltages.

According to an embodiment, at least two of the plurality of body bias voltages are at a higher level than the first power supply voltage.

According to an embodiment, the body bias voltages are generated by a voltage down converter.

According to an embodiment, the voltage down converter is supplied with both the first power supply voltage and the second power supply voltage.

According to an embodiment, the second supply voltage is supplied by an external voltage source and the first supply voltage is generated internally at the semiconductor device.

According to an embodiment, the plurality of body bias voltages comprises at least three different voltage levels.

According to an embodiment, the command includes a power down mode and a self refresh mode, and the body bias voltage generated for the self refresh mode is higher than the body bias voltage level for the power down mode.

According to an embodiment, at least two different body bias voltage levels are generated for the power down mode.

According to an embodiment, the plurality of body bias voltages are generated without use of any capacitor for energy storage or discharge.

A handheld device is also provided, comprising: a processor; a display; and a semiconductor device, comprising a memory device having a plurality of transistors supplied with a first power supply voltage; a body bias control unit configured to detect a command and to generate a body bias selection signal; and a body bias voltage generator supplied with a second power supply voltage, the body bias voltage generator configured to generate a plurality of body bias voltages to body bias the plurality of transistors according to the body bias selection signal, wherein the second power supply voltage is at a higher voltage level than the first power supply voltage.

According to an embodiment, the handheld device further includes a wireless transceiver and an audio processor.

BRIEF DESCRIPTION OF THE DRAWINGS

The above and other features will become apparent from the following description with reference to the following figures, wherein like reference numerals refer to like parts throughout the various figures unless otherwise specified, and wherein

FIG. 10 is a flow chart of a body bias method of a semiconductor device according to an embodiment of the inventive concept;

DETAILED DESCRIPTION

Figure 1:
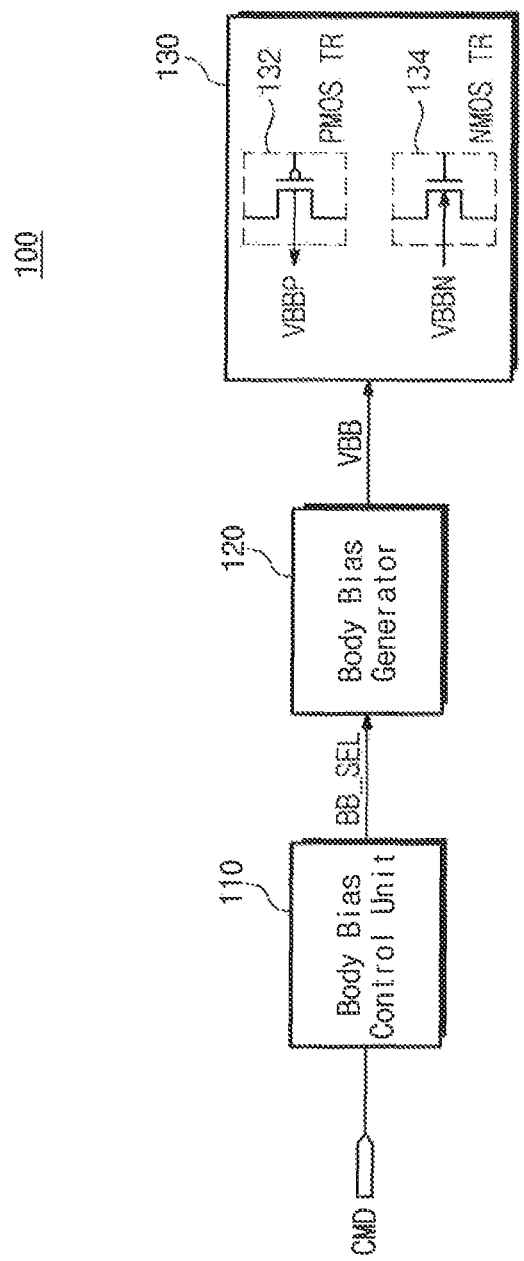
FIG. 1 is a block diagram of semiconductor device according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. Below, features and functions of the inventive concept will be exemplarily described using a synchronous DRAM as a semiconductor device. However, the inventive concept is not limited thereto. Below, embodiments of the inventive concept will be described with reference to accompanying drawings.

FIG. 1 is a block diagram schematically illustrating a semiconductor device according to an embodiment of the inventive concept.

Referring to FIG. 1, a semiconductor device 100 may include a body bias control unit 110, a body bias generator 120, and a function block 130. The semiconductor device 100 may control a body voltage VBB provided to the function block 130 according to a command CMD.

The body bias control unit 110 may monitor a command CMD received by the semiconductor device 100. The body bias control unit 110 may generate a body bias selection signal BB_SEL in response to the command CMD. Examplary commands may signal different operational modes, e.g., power down, self-refresh, or active, etc. If a command CMD corresponding to a self-refresh operation is received, the body bias control unit 110 may select the body voltage VBB provided to the function block 130 during execution of the self-refresh operation. If an active command is received, the body bias control unit 110 may select the body voltage VBB provided to the function block 130 during an active mode period. The body bias control unit 110 may output the body bias selection signal BB_SEL including the selected voltage level of the body voltage VBB.

The body bias generator 120 may generate the body voltage VBB in response to the body bias selection signal BB_SEL. The body bias generator 120 may provide the function block 130 with the body voltage VBB. A level of the body voltage VBB generated by the body bias generator 120 may be selectively controlled according to the command CMD. For example, the body bias generator 120 may generate the body voltage VBB by down-converting an external high voltage Vext or VDD1 provided from the outside of the semiconductor device 100.

The function block 130 may be a group of circuits for performing various calculation and memory functions according to data or control signals provided to the semiconductor device 100. The function block 130 may include various circuits performing an overall function of the semiconductor device 100. The function block 130 may include a cell array of a memory device or control logics. The function block 130 includes a PMOS transistor 132 or an NMOS transistor 134.

In addition, the function block 130 may be supplied with the body voltage VBB from the body bias generator 120. The body voltage VBB may be used as a body region voltage of the PMOS transistor 132 or the NMOS transistor 134 of the function block 130. Different levels of body voltages may be applied to the PMOS transistor 132 or the NMOS transistor 134, respectively. A body voltage VBB is varied according to an input command CMD of the semiconductor device 100 and VBB is applied to the PMOS transistor 132 and/or the NMOS transistor 134.

In a case where the semiconductor device 100 of the inventive concept is a synchronous DRAM, the semiconductor device 100 may enter a power down mode according to an input command CMD. If an active command is received, a mode of operation of the semiconductor device 100 may be switched from the power down mode to an active mode. In such instance, the time requested for the body voltage VBB of the PMOS transistor 132 or the NMOS transistor 134 to stabilize greatly affect the performance of the semiconductor device 100. During the power down mode, the flow of leakage current may be suppressed by application of the body voltage VBB. Thus, power consumption of the function block 130 may be reduced by controlling the body voltage VBB.

Basic components of the semiconductor device 100 of the inventive concept are described. However, it is well understood that the semiconductor device 100 further comprises a number of components connected with the above-described components. Herein, the semiconductor device 100 may be a synchronous DRAM that includes volatile memory cells. Alternatively, the semiconductor device 100 may be a non-volatile semiconductor memory device that includes non-volatile memory cells. Still alternatively, the semiconductor device 100 may be formed of a system on chip that includes a plurality of intellectual properties.

In addition, a command CMD may be provided from an external device to the semiconductor device 100. However, the inventive concept is not limited thereto. For example, a command CMD may be generated within the semiconductor device 100.

Figure 2:
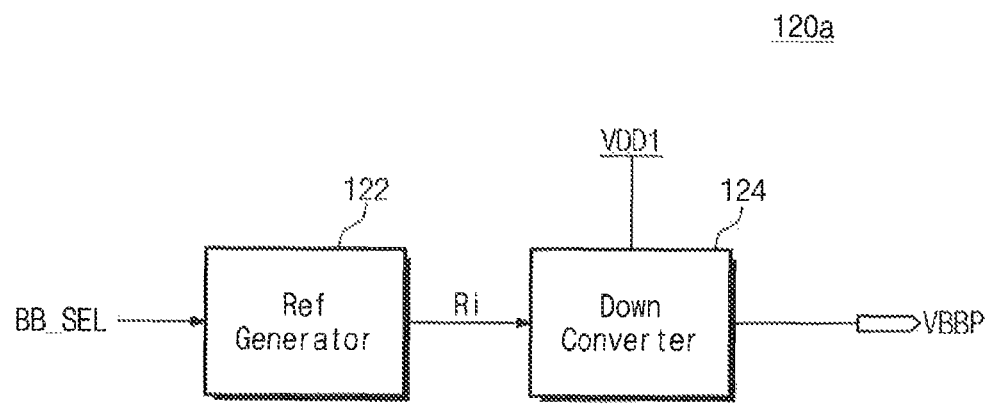
FIG. 2 is a block diagram of a body bias generator of FIG. 1.

FIG. 2 is a block diagram schematically illustrating a body bias generator of FIG. 1.

Referring to FIG. 1 and FIG. 2, a body bias generator 120a may include a reference generator 122 and a down converter 124. The down converter 124 may generate a body voltage VBBP of a PMOS transistor 132 included in a function block 130.

The reference generator 122 may generate a reference voltage Ri having a level selected in response to a body bias selection signal BB_SEL. The reference generator 122 may be a band-gap reference voltage generator or a MOS-type bootstrap reference voltage generator. The reference generator 122 may select one of a plurality of reference voltages in response to the body bias selection signal BB_SEL.

For example, in the event that an input command CMD corresponds to a self-refresh operation, the reference generator 122 may generate the reference voltage Ri corresponding to the self-refresh operation. A level of a body voltage VBBP may be decided by the reference voltage Ri corresponding to the self-refresh operation. A level of the body voltage VBBP provided during the self-refresh operation may be decided to minimize the amount of leakage current of a transistor 132/134. On the other hand, at an active mode, a level of the body voltage VBBP may be decided to secure the performance of a function block 130. In this case, the reference generator 122 may generate a reference voltage Ri corresponding to an active mode body voltage VBBP_ACT.

At a power down mode of a semiconductor device 100, a level of the body voltage VBBP may be decided to minimize a leakage current of the function block 130. In this case, the reference generator 122 may generate a reference voltage Ri corresponding to a power down body voltage VBBP_PDi. The power down mode may be classified in a number of ways. For example, a power down mode may be classified according to the level of power or current consumed. Thus, the reference generator 122 may generate reference voltages having levels corresponding to the various power down modes. According to embodiments of the present inventive concept, at least three different power down mode body voltage levels can be generated.

The down converter 124 may generate the body voltage VBBP using a first power supply voltage VDD1. The down converter 124 may generate the body voltage VBBP corresponding to the reference voltage Ri from the reference generator 122. For example, the down converter 124 generates the body voltage VBBP by down-converting the first power supply voltage VDD1. Herein, the first power supply voltage VDD1 may mean an external high voltage Vext provided from the outside of a semiconductor device 100. A second power supply voltage VDD2 may be an internal voltage Vint generated within the semiconductor device 100.

The body bias generator 120a may generate the body voltage VBBP of a PMOS transistor 132 according to an input command CMD. The body voltage generator 120a may generate a body voltage VBBN of an NMOS transistor 134 to have a fixed level. Alternatively, the body voltage generator 120a may dynamically control the body voltages VBBP and VBBN of the PMOS transistor 132 and the NMOS transistor 134 according to an. input command CMD. Also, in some cases, a body voltage varied according to an input command CMD may be applied to one of the PMOS transistor 132 and the NMOS transistor 134.

Figure 3:
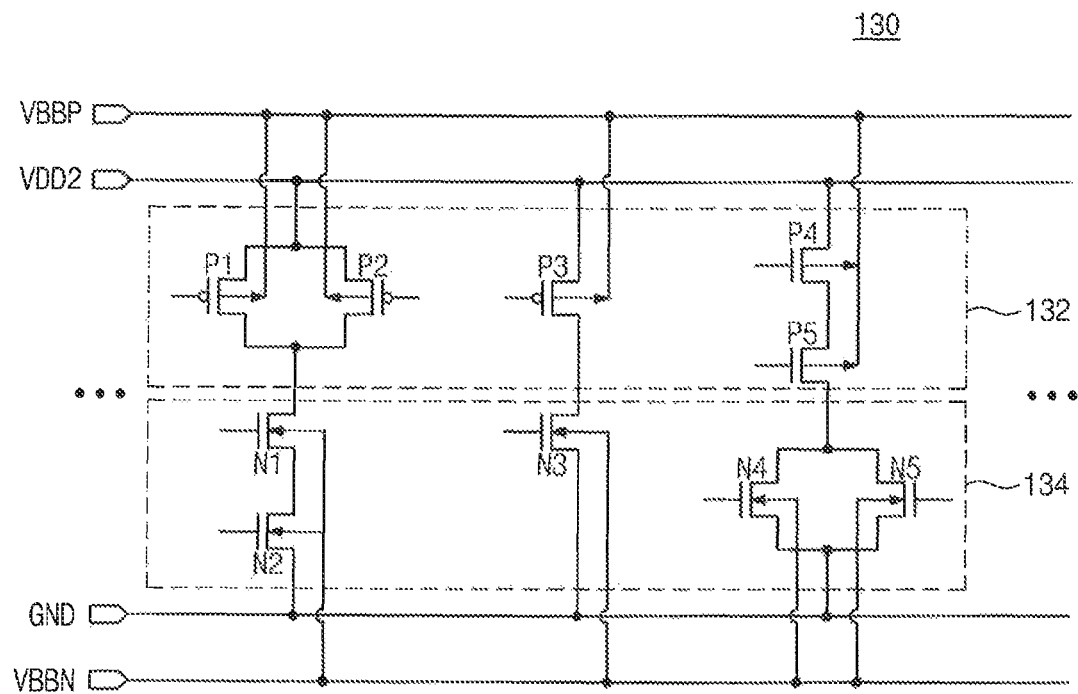
FIG. 3 is a circuit diagram schematically illustrating transistors included in a function block of FIG. 1.

FIG. 3 is a circuit diagram schematically illustrating transistors included in a function block of FIG. 1.

Referring to FIG. 3, a function block 130 may include a plurality of PMOS transistors 132 and a plurality of NMOS transistors 134. Although not shown, the function block 130 may further include various storage elements.

The PMOS transistors 132 may mean a part or all of the PMOS transistors included in the function block 130. A second power supply voltage VDD2 may be applied to sources of some transistors of the PMOS transistors 132. Sources of other transistors of the PMOS transistors 132 may be connected with sources or drains of PMOS or NMOS transistors. Drains of the PMOS transistors 132 may be connected with drains of NMOS transistors or sources of other PMOS transistors. A PMOS body voltage VBBP may be applied to bodies of the PMOS transistors 132 of the function block 130.

The NMOS transistors 134 may mean a part or all of NMOS transistors included in the function block 130. Drains of some transistors of the NMOS transistors 134 may be connected with sources or drains of PMOS or NMOS transistors in the function block 130. Sources of the NMOS transistors 134 may be grounded or connected with drains or sources of NMOS or PMOS transistors in the function block 130. An NMOS body voltage VBBN provided from a body bias generator 120 may be applied to bodies of the NMOS transistors 134 of the function block 130.

The transistor elements of the function block 130 may be supplied with the body voltages VBBP and VBBN as described above, but supplying VBBP and VBBN may not be limited to transistors illustrated in FIG. 3.

Figure 4A:
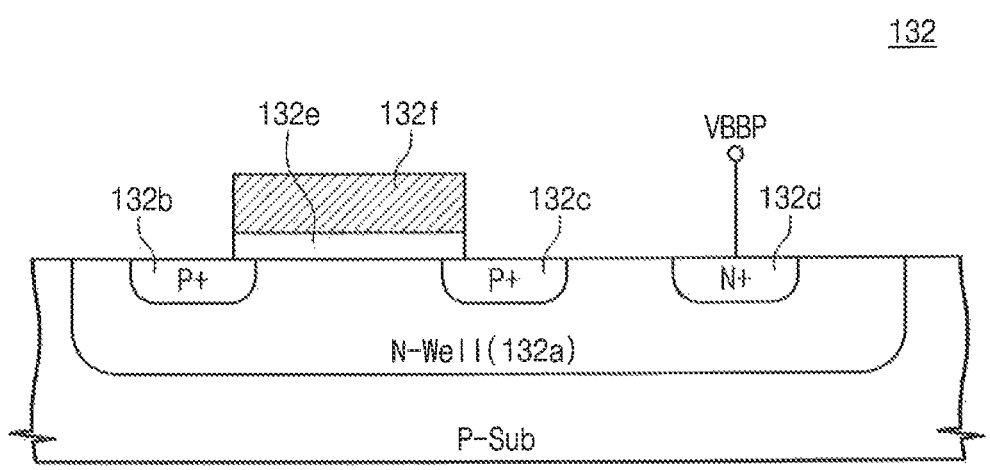
FIGS. 4A and 4B are cross-sectional views of a PMOS transistor and an NMOS transistor.
Figure 4B:
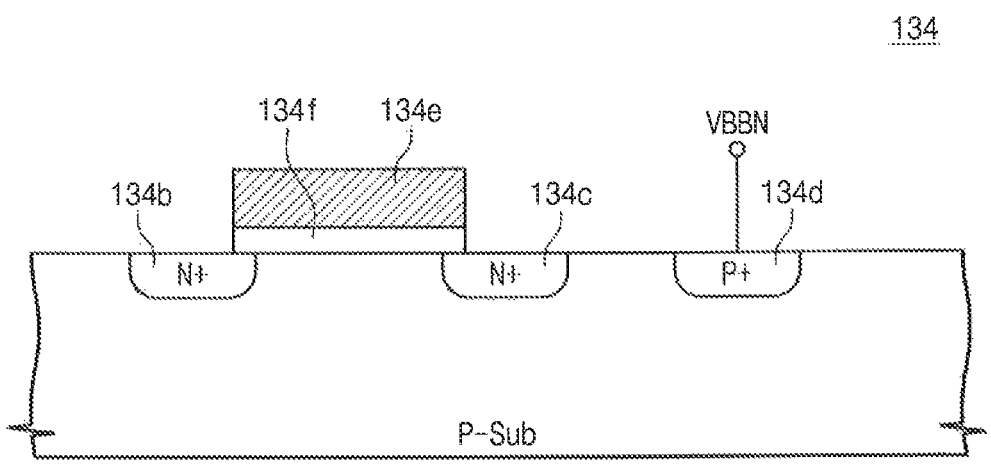

FIGS. 4A and 4B are cross-sectional views of a PMOS transistor and an NMOS transistor illustrated in FIG. 3. FIG. 4A is a cross-sectional view of a PMOS transistor 132, and FIG. 4B is a cross-sectional view of an NMOS transistor 134.

Referring to FIG. 4A, an N-well 132a may be formed at a P-type substrate P-Sub to form the PMOS transistor 132. The N-well 132a may be formed by injecting N-type dopants into the P-type substrate P-Sub. Then, P+ doping regions 132b and 132c for a source and a drain of the PMOS transistor 132 may be formed at the N-well 132a. An N+ doping region 132d for providing a PMOS body voltage VBBP may be formed at the N-well 132a. A gate insulation film 132e and a gate electrode 132f may be sequentially stacked. The gate insulation film 132e may be formed of an oxide film, a nitride film or a film formed by stacking the oxide film and the nitride film. Also, the gate insulation film 132e may be formed of a metal oxide film having high dielectric constant, a stack film formed by stacking the metal oxide film in a lamination structure, or a mixed film formed by mixing the metal oxide film and the stack film. The gate electrode 132f may be formed of a poly silicon film doped by an impurity ion (e.g., P, As, B, etc.) or a metal film.

In operation, a gate voltage Vg is applied to the gate electrode 132f of the PMOS transistor 132 and a drain voltage Vd and a source voltage Vs are applied to the P+ doping regions 132b and 132c, constituting a drain terminal and a source terminal. In addition, a PMOS body voltage VBBP may be applied to the N+ doping region 132d for a body electrode of the PMOS transistor 132.

Referring to FIG. 4B, N+ doping regions 134b and 134c acting as a drain and a source may be formed at the P-type substrate P-Sub to form the NMOS transistor 134. Also, a P+ doping region 134d for providing an NMOS body voltage VBBN may be formed at the P-type substrate P-Sub. A gate insulation film 134f and a gate electrode 134e may be sequentially stacked.

Figure 5A:
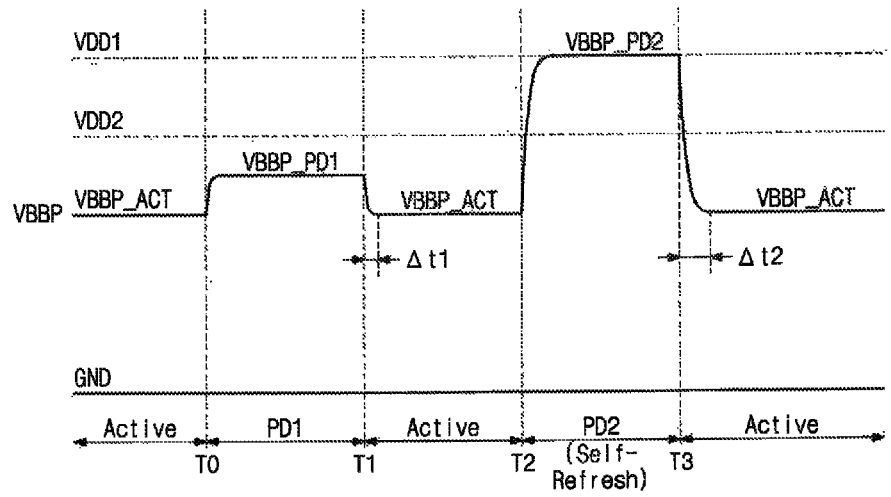
FIG. 5A is a timing diagram illustrating a characteristic of a body voltage generated according to an embodiment of the inventive concept.
Figure 5B:
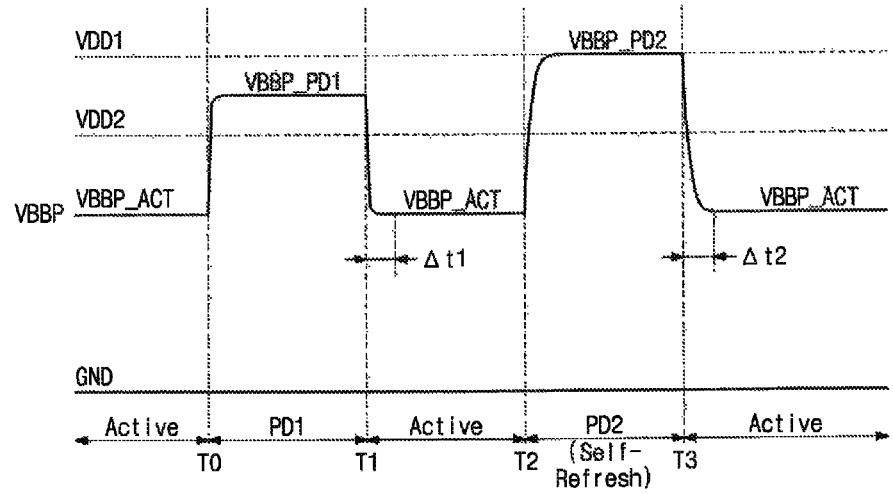
FIG. 5B is a timing diagram illustrating another characteristic of a body voltage generated according to an embodiment of the inventive concept.

FIGS. 5A and 5B are diagrams illustrating characteristics of body voltage VBBP according to an embodiment of the inventive concept. A body bias generator 120 (refer to FIG. 1) may generate various levels of body voltages according to modes of operation. Although not shown in FIGS. 5A and 5B, a body voltage VBBN provided to an NMOS transistor 134 may have a fixed level. For example, the body voltage VBBN may have a ground level Vss, or a fixed level higher than the ground level Vss, irrespective of the mode of operation.

Before T0, an active command is provided to a semiconductor device 100. A body bias generator 120 generates an active body voltage VBBP_ACT. At this time, a PMOS transistor 132 of the semiconductor device 100 may be biased by the active body voltage VBBP_ACT. In a synchronous DRAM, the PMOS transistor 132 included in a sense amplifier or control logic has to operate at a fast operating speed during the active mode of a memory bank. The active body voltage VBBP_ACT may be set to a level suitable for a fast switching speed of the PMOS transistor 132, for example, at about 0.9v. The active mode may accompany a data write operation.

At T0, the semiconductor device 100 exits from the active mode and enters a first power down mode PD1. For example, the first power down mode PD1 may be a standby power mode. If a command CMD corresponding to the first power down mode PD1 is provided, a body bias control unit 110 may detect the command CMD corresponding to the first power down mode PD1. The body bias generator 120 may generate a PMOS body voltage VBBP_PD1 corresponding to the first power down mode PD1, for example, at a voltage level of about 1.1 v (FIG. 5A) and about 1.4 v (FIG. 5B). The PMOS body voltage VBBP_PD1 may be applied to a PMOS transistor 132.

At T1, if an active command is received, the semiconductor device 100 may exit from the first power down mode PD1. A PMOS body voltage VBBP_ACT should be quickly set up to provide the reliability of an operation corresponding to the input active command. Then, an operation corresponding to the input active command may be performed. At this time, an active body voltage VBBP_ACT may be provided to a body region of the PMOS transistor 132 in the semiconductor device 100. There may be required a power down exit time Δt1 until a voltage for the body of the PMOS transistor 132 is stably set to a target level VBBP_ACT.

The duration of the power down exit time Δt1 needed is based on a level of power or current consumed. For example, the time needed to stabilize a body voltage after a power down mode is longer for a larger power consumed. As can be seen in FIGS. 5A and 5B. Δt1 is longer in FIG. 5B due to the higher VBBP_PD1. On the other hand, a higher body voltage VBBP_PD1 provided at a power down mode reduces the amount of leakage current consumed at a function block 130 of the semiconductor device 100. At T2, a command corresponding to a second power down mode PD2 is received, and the components of the semiconductor device 100 may be set to a bias corresponding to the second power down mode PD2. The second power down mode PD2 may be a self-refresh mode of operation, for example. At the second power down mode PD2, a PMOS body voltage VBBP_PD2 is applied to the PMOS transistor 132. The body bias generator 120 generates the PMOS body voltage VBBP_PD2 corresponding to the second power down mode PD2. During a self-refresh operation, the PMOS body voltage VBBP_PD2 is applied to a body region of the PMOS transistor 132.

The PMOS body voltage VBBP_PD2 provided during the self-refresh operation may have a relatively high level, for example, at about 1.8 v. With a relatively higher body voltage, the threshold voltage at the PMOS is increased to minimize sub-threshold leakage current consumption. At T3, the semiconductor device 100 may exit from the second power down mode PD2 according to an input of an active command. An active body voltage VBBP_ACT has to be quickly set up to provide the reliability of execution of the input active command. However, there may be required a power down exit time Δt2 until a body voltage of the PMOS transistor 132 reaches a target level VBBP_ACT.

At the self-refresh operation, a large amount of current may be internally consumed in a core and a large amount of power may be consumed. Thus, the power down exit time Δt2 may take longer. However, if a relatively high PMOS body voltage VBBP_PD2 is provided during the self-refresh operation, power consumption may be relatively reduced. A body bias method according to an embodiment of the inventive concept is described using a timing diagram. Herein, for purposes of illustration, the inventive concept is described using PMOS body voltages VBBP_ACT and VBBP_PDi provided to a body region of the PMOS transistor 132. However, a level of a body voltage provided to an NMOS transistor 134 may be adaptively changed, for example, according to an input command, so that power consumption at the power down mode is minimized. Thus, a power down exit time may be shortened through an adaptive body voltage control scheme of the inventive concept.

Figure 6:
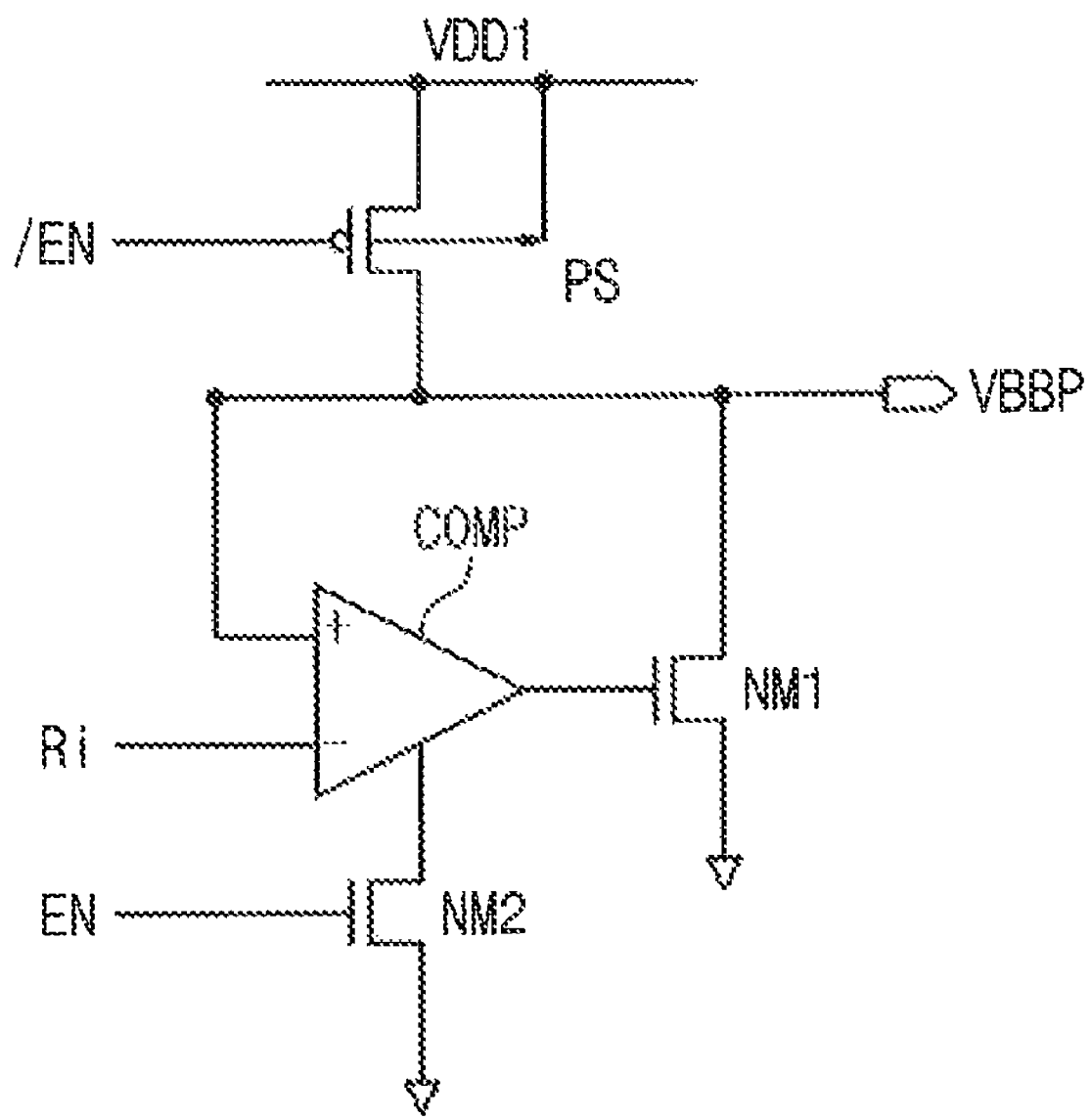
FIG. 6 is a circuit diagram of a down converter according to an embodiment of the inventive concept.

FIG. 6 is a circuit diagram illustrating a down converter of FIG. 2.

Referring to FIG. 6, a down converter 124a may include a power switch PS, a comparator COMP, and NMOS transistors NM1 and NM2. The down converter 124a may generate a PMOS body voltage VBBP corresponding to a reference voltage Ri. Herein, the PMOS body voltage VBBP may be provided at a power down mode or generated irrespective of the mode of operation.

A first power supply voltage VDD1 provided from an external device may be applied to one terminal of the power switch PS. The power switch PS may output the first power supply voltage VDD1 to an output terminal of the down converter 124a in response to an enable signal /EN.

The comparator COMP may compare a PMOS body voltage VBBP of the output terminal with a reference voltage Ri to control a voltage of the output terminal. The PMOS body voltage VBBP fed back from the output terminal may be applied to a non inverting input terminal (+) of the comparator COMP. The reference voltage Ri provided from a reference generator 122 (refer to FIG. 2) may be applied to an inverting input terminal (−) of the comparator COMP. If the PMOS body voltage VBBP is lower than the reference voltage Ri, the NMOS transistor NM1 may be turned off by an output of the comparator COMP. If the PMOS body voltage VBBP is higher than the reference voltage Ri, the NMOS transistor NM1 may be turned on by an output of the comparator COMP. A level of the PMOS body voltage VBBP at the output terminal may be set to be equal to that of the reference voltage Ri through the above-described down-converting manner.

The power switch PS and the comparator COMP may be turned on or activated when the enable signal EN has a logically high level. The enable signal EN may be only activated at a power down mode PDi. Alternatively, the enable signal EN may be activated at the power down mode PDi and an active mode, respectively.

Figure 7A:
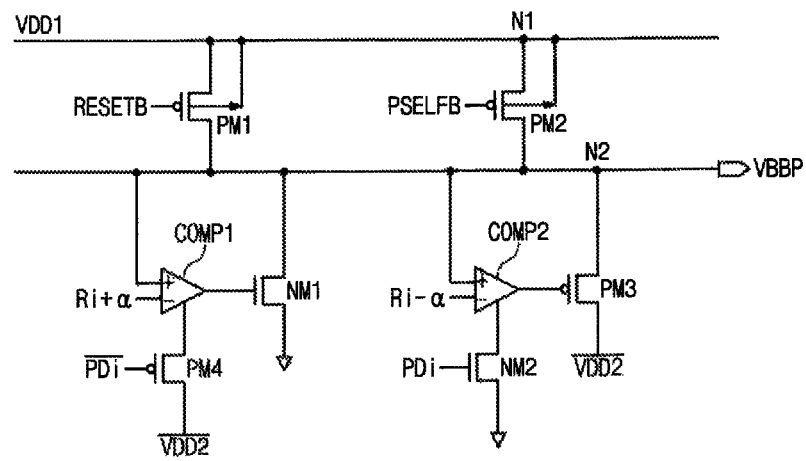
FIG. 7A is a circuit diagram of a down converter according to another embodiment of the inventive concept.
Figure 7B:
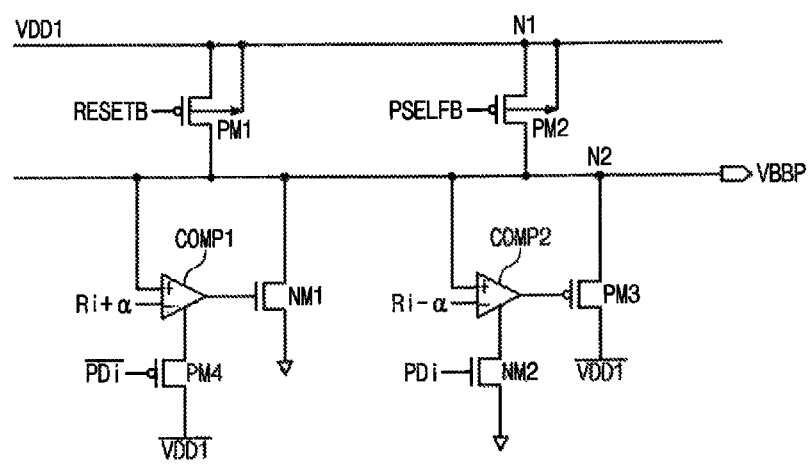
FIG. 7B is a circuit diagram of a down converter according to another embodiment of the inventive concept.

FIGS. 7A and 7B are circuit diagrams illustrating a down converter according to embodiment of the inventive concept.

A down converter 124b may include PMOS transistors PM1, PM2, PM3, and PM4, NMOS transistors NM1 and NM2, and comparators COMP1 and COMP2. The down converter 124b may generate a PMOS body voltage VBBP in a down converting manner.

The down converter 124b may receive a first power supply voltage VDD1 from an external device through a first node N1. The PMOS transistors PM1 and PM2 may transfer the first power supply voltage VDD1 to the second node N2 according to a mode of operation. For example, the PMOS transistor PM1 may connect the first power supply voltage VDD1 to an output terminal N2 at a reset mode of operation. For example, when a control signal RESETB has a logical '0', the PMOS transistor PM1 may be turned on, so that the first power supply voltage VDD1 is supplied to the output terminal N2.

The PMOS transistor PM2 may supply the first power supply voltage VDD1 to the output terminal N2 at a self-refresh mode. For example, when a control signal PSELFB has a logical '0', the PMOS transistor PM2 may be turned on, so that the first power supply voltage VDD1 is supplied to the output terminal N2. Thus, a maximum level of the PMOS body voltage VBBP of the output terminal N2 may be approximate to a first power supply voltage VDD1.

The first power supply voltage VDD1 may be down-converted as described herein below.

The comparators COMP1 and COMP2 and the transistors NM1, NM2, PM3, and PM4 may be provided to adjust a level of the PMOS body voltage VBBP at the output terminal N2 according to a reference voltage Ri. The first comparator COMP1 may control the NMOS transistor NM1 based on the reference voltage Ri varied according to a command or a mode of operation. The NMOS transistor NM1 may pull the output terminal N2 down.

For example, if the body voltage VBBP of the output terminal N2 exceeds a reference voltage (Ri+α), the NMOS transistor NM1 may be turned on by the first comparator COMP1. At this time, charges charged at the output terminal N2 may be discharged to a ground. In this case, the PMOS body voltage VBBP of the output terminal N2 may decrease. If the body voltage VBBP of the output terminal N2 is lower than the reference voltage (Ri+α), the PMOS transistor PM3 may be turned on by the second comparator COMP2. At this time, the output terminal N2 may be charged by a second power supply voltage VDD2, in the embodiment as illustrated in FIG. 7A. In this case, the PMOS body voltage VBBP of the output terminal N2 may increase. Alternatively, VDD1 and serve as both the first and second power supply voltage in the embodiment as shown in FIG. 7B.

The first comparator COMP1 and the second comparator COMP2 may be activated at an active mode, respectively. That is, as the transistors PM4 and NM2 are turned on at an active mode, the comparators COMP1 and COMP2 may be activated. The comparators COMP1 and COMP2 may be activated at power down modes PDi to provide various levels of body voltages VBBP at the power down modes PDi. A control signal PDi may be provided to activate the comparators COMP1 and COMP2.

There is exemplarily described a down converter which down-converts the first power supply voltage VDD1 to generate the PMOS body voltage VBBP. However, it is well understood that the down converter 124b may down-convert the second power supply voltage VDD2 to generate the body voltage VBBP. In addition, there is described an example in which the down converter 124b uses a plurality of comparators. However, the inventive concept is not limited thereto.

Figure 8:
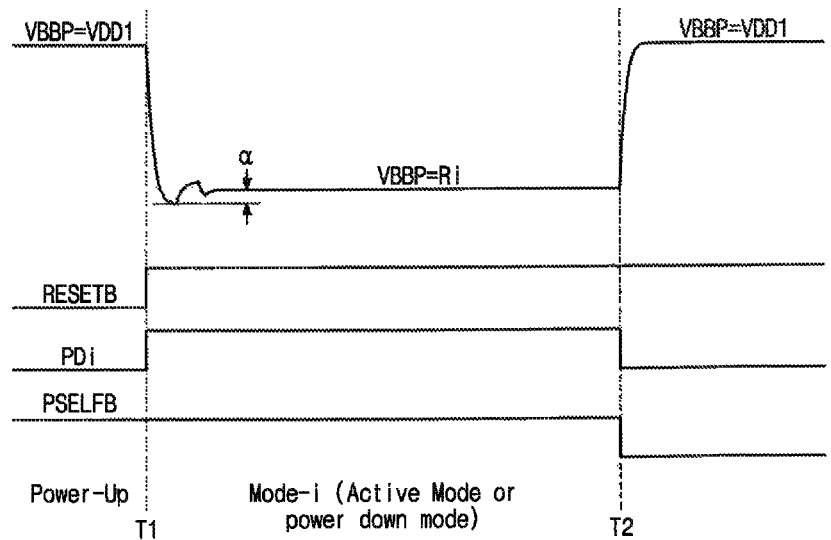
FIG. 8 is a timing diagram of a down converter operation.

FIG. 8 is a timing diagram illustrating an operation of a down converter. Referring to FIGS. 7A, 7B, and 8, a down converter 124b may generate a PMOS body voltage VBBP having an optimal level which is defined with respect to various modes of operation or power down modes.

At a power up mode, a control signal RESETB may be activated to a low level and a control signal PSELFB may be inactivated to a high level. At this time, a mode control signal PDi may be inactivated to a low level. Under this condition, a PMOS transistor PM1 may be turned on and a PMOS transistor PM2 may be turned off. Also, comparators COMP1 and COMP2 may be inactivated. In this case, a pull-up or pull-down operation on an output terminal N2 may be interrupted, so that a first high voltage VDD1 is transferred to the output terminal N2 without converting.

At T1, if the mode control signal PDi is activated, the PMOS transistors PM1 and PM2 turn off. When the comparators COMP1 and COMP2 are activated, the output terminal N2 is pulled up or down. Reference voltages (Ri+α) and (Ri−α) are applied to the comparators COMP1 and COMP2 to output a level of a reference voltage Ri provided, respectively. Herein, an offset 'α' may be a value set to prevent a state at which the comparators COMP1 and COMP2 are simultaneously activated.

At T2, a semiconductor device 100 may enter a self-refresh mode. At this time, the mode control signal PDi may be inactivated to a low level. The control signal RESETB may be inactivated to a high level and the control signal PSELFB may be activated to a low level. With this condition, the PMOS transistor PM1 may be turned off and the PMOS transistor PM2 may be turned on. Also, the comparators COMP1 and COMP2 may be inactivated. At this time, a pull-up or pull-down operation on the output terminal N2 may be interrupted. Under this condition, the first power supply voltage VDD1 may be transferred to the output terminal N2.

In FIGS. 7A, 7B, and 8, there is described an operation of a down converter 124b which generates a PMOS body voltage VBBP using the first power supply voltage VDD1. However, the inventive concept is not limited thereto. It is well understood that various down converters are applied to the down converter 124b of the inventive concept.

Figure 9:
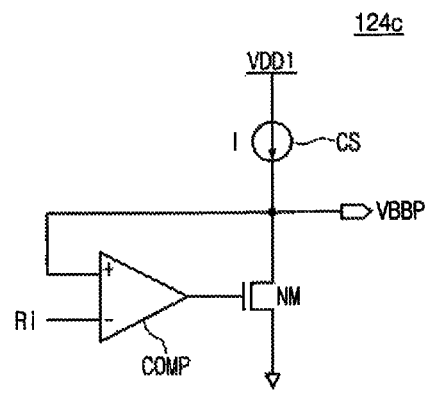
FIG. 9 is a circuit diagram of a down converter according to still another embodiment of the inventive concept.

FIG. 9 is a circuit diagram illustrating a down converter according to still another embodiment of the inventive concept. Referring to FIG. 9, a down converter 124c may generate a PMOS body voltage VBBP with a relatively simple structure. The PMOS body voltage VBBP may include a comparator COMP, an NMOS transistor NM, and a current source CS.

A reference voltage Ri may be applied to an inverting input terminal (−) of the comparator COMP. The reference voltage Ri may be provided from a reference generator 122. A PMOS body voltage VBBP may be applied to a non-inverting input terminal (+) of the comparator COMP. If the PMOS body voltage VBBP is higher than the reference voltage Ri, the NMOS transistor NM may be turned on by the comparator COMP. If the PMOS body voltage VBBP is lower than the reference voltage Ri, the NMOS transistor NM may be turned off by the comparator COMP.

The NMOS transistor NM may pull down a level of the PMOS body voltage VBBP according to the comparison result of the comparator COMP. Herein, the first power supply voltage VDD1 may be a source voltage for down-converting. However, a second power supply voltage VDD2 internally generated and lower in level than the first power supply voltage VDD1 may be used as a source voltage of the down converter 124c.

The current source CS may pull an output terminal outputting the PMOS body voltage VBBP up. An excessive load current may be generated at a bulk of a PMOS transistor 132 that is supplied with the PMOS body voltage VBBP. In this case, the PMOS body voltage VBBP output from an output terminal of the down converter 124c may decrease. A voltage VBBP relatively lowered may be fed back to the non-inverting input terminal (+) of the comparator COMP. At this time, an output voltage of the comparator COMP may be further lowered. As a result, a gate voltage of the NMOS transistor NM may decrease, so that the PMOS body voltage VBBP at the output terminal of the down converter 124e may again increase. With this feedback operation, the PMOS body voltage VBBP may be stably set to a level of the reference voltage Ri.

There are described examples of down converters 124a, 124b and 124c which are configured to output a body voltage VBBP of a PMOS transistor 132 by adjusting a level of a power supply voltage VDD1 provided from an external device. However, the inventive concept is not limited thereto. In addition, it is well understood that the down converters 124a, 124b and 124c generate a body voltage VBBN of an NMOS transistor 134. If a reference voltage Ri is appropriately provided, the body voltage VBBN of the NMOS transistor 134 may be generated adaptively according to a mode of operation. Further, the use of exemplary down converters 124a, 124b and 124c in various embodiments of the present inventive concept facilitate the changes in different levels of body bias voltages depending on operation modes in a speedy fashion, for example, within 200 ns.

FIG. 10 is a flow chart illustrating a body bias method of a semiconductor device according to an embodiment of the inventive concept. Referring to FIG. 10, a semiconductor device 100 of the inventive concept may detect a command to dynamically control a level of a body voltage VBBP of a PMOS transistor 132. Herein, a command may be a command provided from an external device. However, a command can be generated from within the semiconductor device 100.

In operation S110, an input command CMD may be detected. A body bias control unit 110 (refer to FIG. 1) may detect a command provided from an external device or a command internally generated. The body bias control unit 110 may detect whether the input command CMD is a command for entering one of a plurality of power down modes PDi, a command for entering a self-refresh mode or an active command. In operation S120, the body bias control unit 110 may decide a level of a body voltage VBBP based on the input command CMD. In particular, there may be decided a level of a body voltage VBBP_PDi for controlling a level of leakage current that flowed at the power down mode PDi. A level of a body voltage VBBP_PDi corresponding to each command may be decided at a test level. For example, a level of a body voltage VBBP_PDi corresponding to a detected command may be stored at a table, and a selection signal BB_SEL may be generated to select a level of a body voltage VBBP_PDi corresponding to the input command CMD. If a level of the body voltage VBBP_PDi is decided, a corresponding reference voltage Ri may be decided.

In operation S130, whether the detected command is a command indicating a self-refresh mode, a command indicating a power down mode or an active command may be determined. If the detected command corresponds to a self-refresh operation, the method may proceed to operation S140. If the detected command corresponds to an active mode, the method may proceed to operation S150. If the detected command corresponds to one of a plurality of power down modes PDi, the method may proceed to operation S160.

In operation S140, a body bias generator 120 may supply a first power supply voltage VDD1 to a PMOS transistor 132 of a function block 130 as a body voltage VBBP. In this case, a leakage current of the PMOS transistor 132 may be minimized.

In operation S150, the body bias generator 120 may generate an active body voltage VBBP_ACT to supply it to the PMOS transistor 132. In this case, a threshold voltage of the PMOS transistor 132 may be optimized.

In operation S160, the body bias generator 120 may generate one of a plurality of power down body voltages VBBP_PDi. Herein, the power down body voltages VBBP_PDi may be set to have various levels.

In operation S170, the semiconductor device 100 may detect whether a Driving mode corresponds to a power off status. If the driving mode does not correspond to the power off status, the method may return to operation S110, waiting to detect an input comment. If the driving mode corresponds to the power off status, the method is ended.

There is described an adaptive body bias method in which a level of a transistor body voltage is changed according to a detected command. According to body bias method of the inventive concept, various levels of body voltages are provided according to modes of operation. Thus, a level of current consumed at a power down mode of the semiconductor device 100 may be minimized.

Figure 11A:
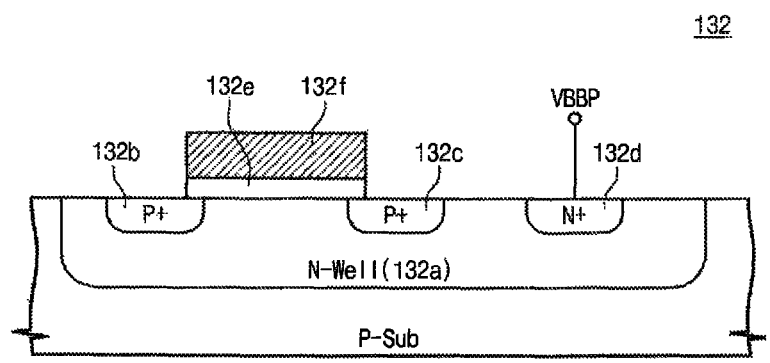
FIGS. 11A and 11B are cross-sectional views of a PMOS transistor and an NMOS transistor according to another embodiment of the inventive concept.
Figure 11B:
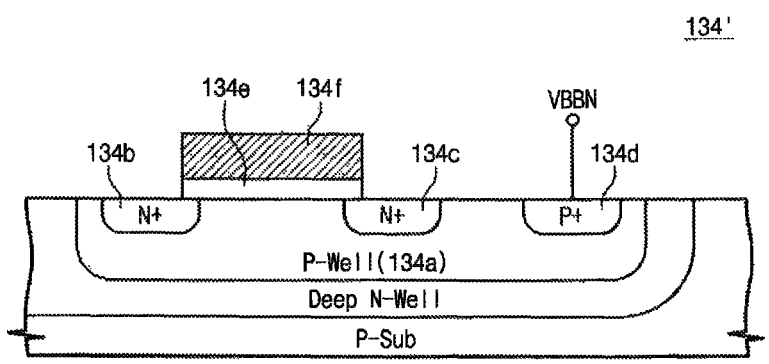

FIGS. 11A and 11B are cross-sectional views of a PMOS transistor and an NMOS transistor according to another embodiment of the inventive concept.

Referring to FIG. 11A, an N-well 132a may be formed at a P-type substrate P-Sub to form a PMOS transistor 132. The N-well 132a may be formed by injecting N-type dopants into the P-type substrate P-Sub. Then, P+ doping regions 132b and 132c for a source and a drain of the PMOS transistor 132 may be formed at the N-well 132a. An N+ doping region 132d for providing a body voltage VBBP may be formed at the N-well 132a. A gate insulation film 132e and a gate electrode 132f may be sequentially stacked. The gate insulation film 132e may be formed of an oxide film, a nitride film or a film formed by stacking the oxide film and the nitride film. Also, the gate insulation film 132e may be formed of a metal oxide film having high dielectric constant, a stack film formed by stacking the metal oxide film in a lamination structure, or a mixed film formed by mixing the metal oxide film and the stack film. The gate electrode 132f may be formed of a poly silicon film doped by an impurity ion (e.g., P, As, B, etc.) or a metal film.

With this structure, if the body voltage VBBP increases, a reverse bias between the P+ doping regions 132b and 132c and the N-well 132a may increase. Thus, there may be reduced a leakage current flowing between a source and a drain of the PMOS transistor 132 formed of the P+ doping regions 132b and 132c, respectively.

Referring to FIG. 11B, to form an NMOS transistor 134', a deep N-well 132a may be formed at the P-type substrate P-Sub and a P-well 134a may be formed at the deep N-well 132a. Then, N+ doping regions 134b and 134c for a source and a drain of the NMOS transistor 134' may be formed at the P-well 134a. A P+ doping region 134d for providing a body voltage VBBN may be formed at the P-well 134a. A gate insulation film 134e and a gate electrode 134f may be sequentially stacked. With this structure, if the body voltage VBBN being a positive or negative voltage increases, a reverse bias between the N+ doping regions 134b and 134c and the substrate P-Sub may increase. In this case, there may be reduced a leakage current flowing between a source and a drain of the NMOS transistor 134' formed of the N+ doping regions 134b and 134c, respectively.

Figure 12:
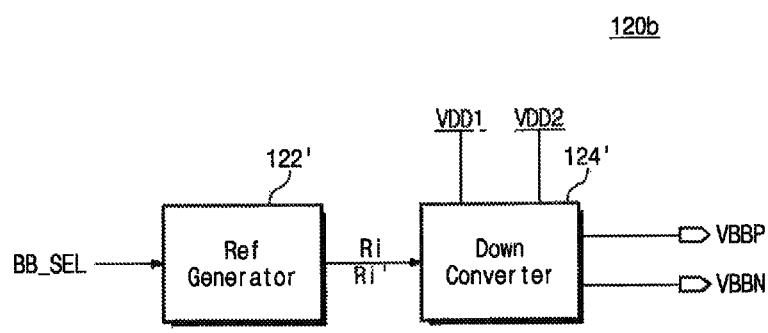
FIG. 12 is a block diagram of a body bias generator of FIG. 1 according to another embodiment of the inventive concept.

FIG. 12 is a block diagram illustrating a body bias generator of FIG. 1 according to another embodiment of the inventive concept. Referring to FIG. 12, a body bias generator 120b may include a reference generator 122' and a down converter 124'. The down converter 124' may generate a body voltage VBBN of an NMOS transistor 134 and a body voltage VBBP of a PMOS transistor 132 included in a function block 130 (refer to FIG. 1).

The reference generator 122' may generate reference voltages Ri and Ri' having levels selected in response to a body bias selection signal BB_SEL. Herein, the reference voltage Ri may be used to generate the body voltage VBBP of the PMOS transistor 132, and the reference voltage Ri may be used to generate the body voltage VBBN of the NMOS transistor 134'. The reference generator 122' may be a band-gap reference voltage generator or a bootstrap reference voltage generator.

The reference generator 122' may select one of a plurality of reference levels in response to the body bias selection signal BB_SEL. For example, in the event that a self-refresh command is provided, the reference generator 122' may generate the reference voltages Ri and Ri' for minimizing leakage currents of the PMOS transistor 132 and the NMOS transistor 134'. If an active command is received, the reference generator 122' may generate the reference voltages Ri and Ri' for optimizing operating speeds of the PMOS transistor 132 and the NMOS transistor 134'.

The down converter 124' may generate the body voltages VBBP and VBBN respectively provided to the PMOS transistor 132 and the NMOS transistor 134' based on the reference voltages Ri and Ri' from the reference generator 122'. The down converter 124' may generate the body voltages VBBP and VBBN respectively provided to the PMOS transistor 132 and the NMOS transistor 134' based on a first power supply voltage VDD1 or a second power supply voltage VDD2. The down converter 124' may generate the body voltages VBBP and VBBN in high speed by down-converting the first power supply voltage VDD1 or the second power supply voltage VDD2.

There is described an example in which the down converter 124' generates the body voltages VBBP and VBBN by down-converting the first power supply voltage VDD1. However, in some cases, the down converter 124' generates the body voltages VBBP and VBBN using a high-speed charge pump.

Figure 13A:
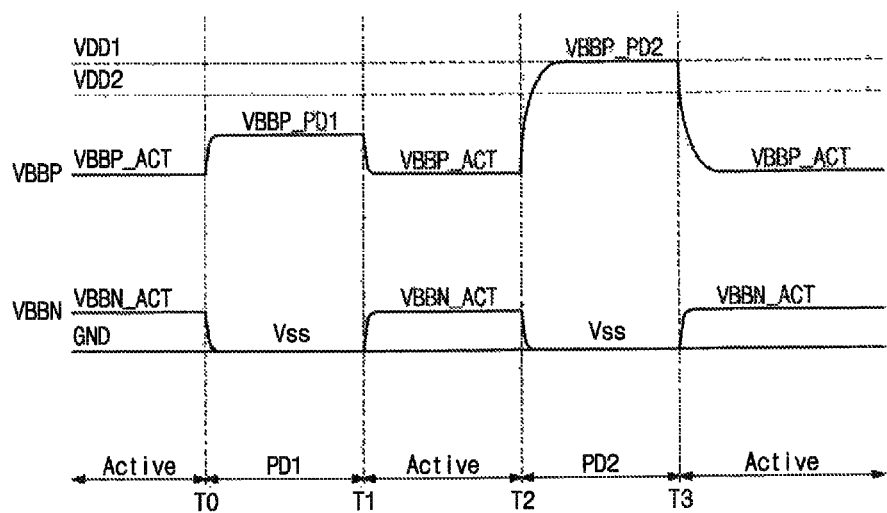
FIG. 13A and FIG. 13B are a waveform diagrams illustrating output voltages of a down converter of FIG. 12.
Figure 13B:
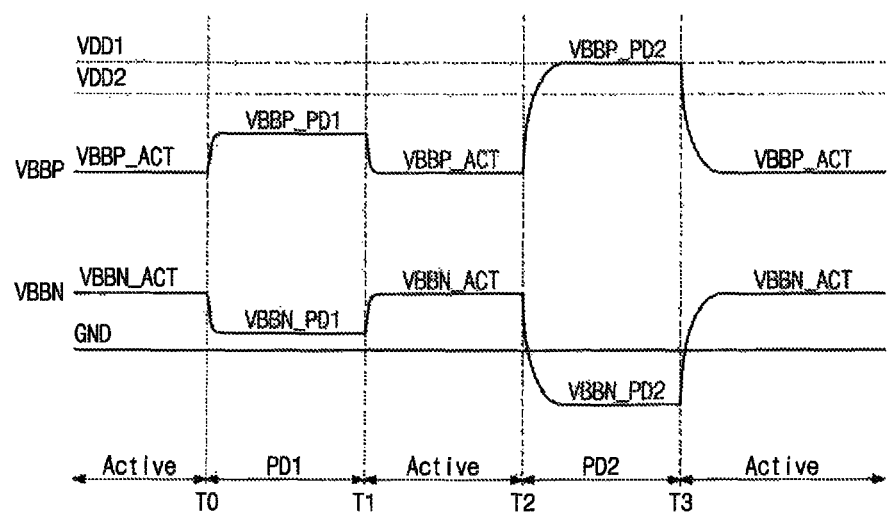

FIGS. 13A and 13B illustrate output voltages of a down converter of FIG. 12. Body voltages VBBP and VBBN may be changed adaptively according to an input command.

It is assumed that an active command is provided to a semiconductor device 100 before T0. In this case, a body bias generator 120 may generate active body voltages VBBP_ACT and VBBN_ACT. A PMOS transistor 132 may be supplied with the active body voltage VBBP_ACT, and an NMOS transistor 134' may be supplied with the active body voltage VBBN_ACT.

At T0, the semiconductor device 100 may enter a first power down mode PD1 according to a power down command. At this time, the active mode of the semiconductor device 100 may be ended. If a body bias control unit 110 detects a command CMD corresponding to the first power down mode PD1, the body bias generator 120 may generate a PMOS body voltage VBBP_PD1 corresponding to the first power down mode PD1. The PMOS body voltage VBBP_PD1 may be applied to the PMOS transistor 132. The body bias generator 120 can generate an NMOS body voltage VBBN_PD1 corresponding to the first power down mode PD1. The PMOS body voltage VBBP_PD1 may be applied to the PMOS transistor 132. As illustrated in FIG. 13A, the NMOS body voltage VBBN_PD1 may have a ground voltage Vss.

At T1, if an active command is received, the semiconductor device 100 may exit from the first power down mode PD1. A PMOS body voltage VBBP_ACT is quickly set up to provide the reliability of an operation corresponding to the input active command. At this time, the PMOS transistor 132 included in a core of the semiconductor device 100 may be biased by the body voltage VBBP_ACT. The NMOS transistor 134' may be biased by the body voltage VBBN_ACT.

At T2, a command corresponding to a second power down mode PD2 may be received. If a command corresponding to the second power down mode PD2 is received, all components of the semiconductor device 100 may be supplied with a bias corresponding to the second power down mode PD2. For example, the second power down mode PD2 may be a self-refresh mode of operation. At the second power down mode PD2, a PMOS body voltage VBBP_PD2 may be applied to the PMOS transistor 132. At the second power down mode PD2, the NMOS body voltage VBBN_PD2 may have a ground level Vss.

At T3, an active command may be received, and the semiconductor device 100 may exit from the second power down mode PD2. The active mode body voltages VBBP_ACT and VBBN_ACT are quickly set up to provide the reliability on execution of the input active command.

A body bias method according to an embodiment of the inventive concept is described through a timing diagram. Herein, there is described an example in which body voltages of PMOS and NMOS transistors 132 and 134' are changed adaptively according to a mode of operation.

FIG. 13B is a waveform diagram illustrating an output voltage of a down converter of FIG. 12 according to another embodiment of the inventive concept. Referring to FIG. 13B, body voltages VBBP and VBBN may have various levels according to an input command.

It is assumed that a mode of operation of a semiconductor device 100 is an active mode before T0. At this time, a down converter 14b may generate active mode body voltages VBBP_ACT and VBBN_ACT in response to an active command. The down converter 124b may provide the body voltage VBBP_ACT to a body of a PMOS transistor 132 and the body voltage VBBN_ACT to a body of an NMOS transistor 134. At T0, the semiconductor device 100 may enter a first power down mode PD1. If a command corresponding to the first power down mode PD1 is received, the semiconductor device 100 may be set to a power down mode. For example, operations of control units and logic elements of the semiconductor device 100 may be stopped with their data values being maintained. At the first power down mode PD1 is received, the semiconductor device 100 may be set to a power down mode. At the first power down mode PD1, a body voltage VBBP_PD1 may be applied to the PMOS transistor 132 and a body voltage VBBN_PD1 may be applied to the NMOS transistor 134'.

Levels of the body voltages VBBP_PD1 and VBBN_PD1 of the PMOS and NMOS transistors 132 and 134' at the first power down mode PD1 may be different from those of the body voltages VBBP_ACT and VBBN_ACT at an active mode. For example, a level of the body voltage VBBP_PD1 of the PMOS transistor 132 at the first power down mode PD1 may be higher than that of the body voltage VBBP_ACT at the active mode. On the other hand, a level of the body voltage VBBP_PD2 of the NMOS transistor 134 at the first power down mode PD1 may be lower than that of the body voltage VBBN_ACT at the active mode.

At T1, if an active command is received, the semiconductor device 100 may exit from the first power down mode PD1 and enter an active mode. Setup of a body bias on transistors 132 and 134' in a function block 130 (refer to FIG. 1) may be quickly performed to provide the reliability on execution of the input active command. That is a power down exit time has to be shortened. At the first power down mode PD1 of the inventive concept, the active mode body voltages VBBP_ACT and VBBN_ACT of the transistors 132 and 134' may be stabilized quickly by the body voltage VBBP_PD1 and VBBN_PD1.

At T2, a command corresponding to a second power down mode PD2 may be received. If a command corresponding to the second power down mode PD2 is detected by a body bias control unit 110, the semiconductor device 100 may enter the second power down mode PD2. At the second power down mode PD2, a body bias voltage VBBP_PD2 may be applied to the PMOS transistor 132 and a body bias voltage VBBN_PD2 may be applied to the NMOS transistor 134'.

The second power down mode PD2 may correspond to a power down mode at which a greater amount of leakage current is generated. A body bias generator 120 may generate body voltages VBBP_PD2 and VBBN_PD2 in response to a command corresponding to the second power down mode PD2. The body voltages VBBP_PD2 and VBBN_PD2 may be supplied to a body region of a function block 130. Herein, the body voltage VBBP_PD2 applied to the PMOS transistor 132 may be relatively high. For example, a body voltage of the PMOS transistor 132 at the second power down mode PD2 may be almost approximate to a first power supply voltage VDD1. The body voltage VBBN_PD2 supplied to the NMOS transistor 134' may be lower in level than the body voltage VBBN_PD1 at the first power down mode PD1. For example, a body voltage of the PMOS transistor 132 at the second power down mode PD2 may have a negative voltage level.

At T3, if an active command is received, a mode of operation may be switched from the second power down mode PD2 to an active mode. Active body voltages VBBP_ACT and VBBN_ACT are quickly stabilized to provide the reliability on execution of the input active command.

Herein, there is described an example in which levels of body voltages VBBP_ACT and VBBN_ACT provided at the active mode are constant. However, it is well understood that active body voltages of PMOS and NMOS transistors 132 and 134' can be changed according to a mode of operation.

In addition, a body voltage applied to an NMOS transistor 134' at power down modes PD1 and PD2 or an active mode may be provided by various manners. For example, in a DRAM, voltages for controlling an access transistor of a memory cell may exist. One may be a body bias voltage VBB1 applied to a body of an access transistor. Another may be a control voltage VBB2 applied to a gate of the access transistor. Voltages VBB1 and VBB2 generated through an access transistor bias circuit, a ground voltage GND and a plurality of down converters may be used together as a body voltage applied to the NMOS transistor 134'. In this case, if the voltages VBB1 and VBB2 generated through an access transistor bias circuit are used, a negative voltage may be used as a body voltage applied to the NMOS transistor 134'.

Figure 14:
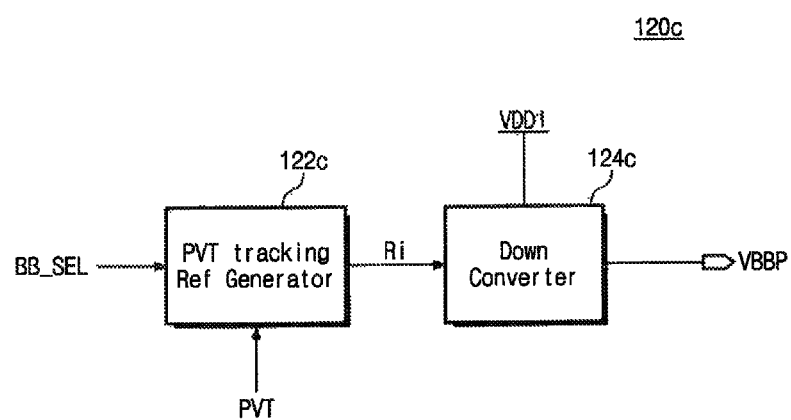
FIG. 14 is a block diagram of a body bias generator of FIG. 1 according to another embodiment of the inventive concept.

FIG. 14 is a block diagram illustrating a body bias generator of FIG. 1 according to another embodiment of the inventive concept. Referring to FIG. 14, a body bias generator 120c may include a PVT estimation reference generator 122c and a down converter 124c.

The PVT estimation reference generator 122c may generate a reference voltage Ri in response to a body bias selection signal BB_SEL. The PVT estimation reference generator 122c may generate the reference voltage Ri based on at least one of process, voltage and temperature variations of a semiconductor device 100. A PVT signal for applying PVT variations may be provided through an additional monitoring block or detected through a monitoring element in the PVT estimation reference generator 122c.

The down converter 124c may generate a body voltage VBBP provided to a PMOS transistor 132 based on the reference voltage Ri from the PVT estimation reference generator 122c. Although not shown in FIG. 14, the down converter 124c may generate a body voltage of an NMOS transistor 134 based on the reference voltage Ri. The down converter 124c may be formed of the above-described components, and a detailed description thereof is omitted.

Figure 15:
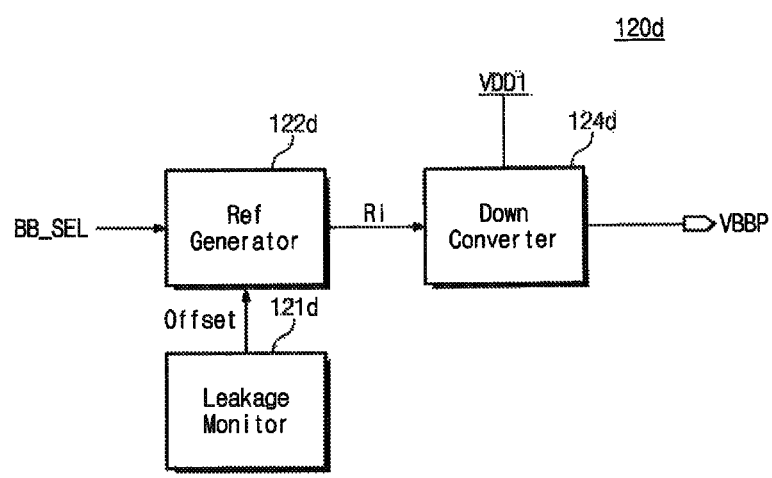
FIG. 15 is a block diagram of a body bias generator of FIG. 1 according to still another embodiment of the inventive concept.

FIG. 15 is a block diagram illustrating a body bias generator of FIG. 1 according to still another embodiment of the inventive concept, Referring to FIG. 15, a body bias generator 120d may include a leakage monitor 121d, a reference generator 122d, and a down converter 124d.

The leakage monitor 121d may monitor the amount of leakage current of transistors 132 and 134 of a function block 130. The leakage monitor 121d may further include dummy transistors to monitor a level of a leakage current generated at a transistor. The leakage monitor 121d may provide an offset to the reference generator 122d according to the detected level of the leakage current.

The reference generator 122d may generate a reference voltage Ri in response to a body bias selection signal BB_SEL. The reference generator 122d may adjust and output a level of the reference voltage Ri based on an offset provided from the leakage monitor 121d. The offset may include information on a level variation in a leakage current according to process, voltage and temperature variations of a semiconductor device 100. Thus, in the event that the reference voltage Ri is generated using an offset, it is possible to generate a body voltage VBBP optimized according to a driving condition.

The down converter 124d may generate a body voltage VBBP provided to a PMOS transistor 132 based on the reference voltage Ri from the reference generator 122d. Although not shown in FIG. 15, the down converter 124d may generate a body voltage of an NMOS transistor 134 based on the reference voltage Ri.

The leakage monitor 121d may be implemented by a user programmable fuse offset. An operating characteristic of a semiconductor device 100 may be detected at a test level, and an offset for providing an optimal body voltage on the detected characteristic may be programmed.

Figure 16:
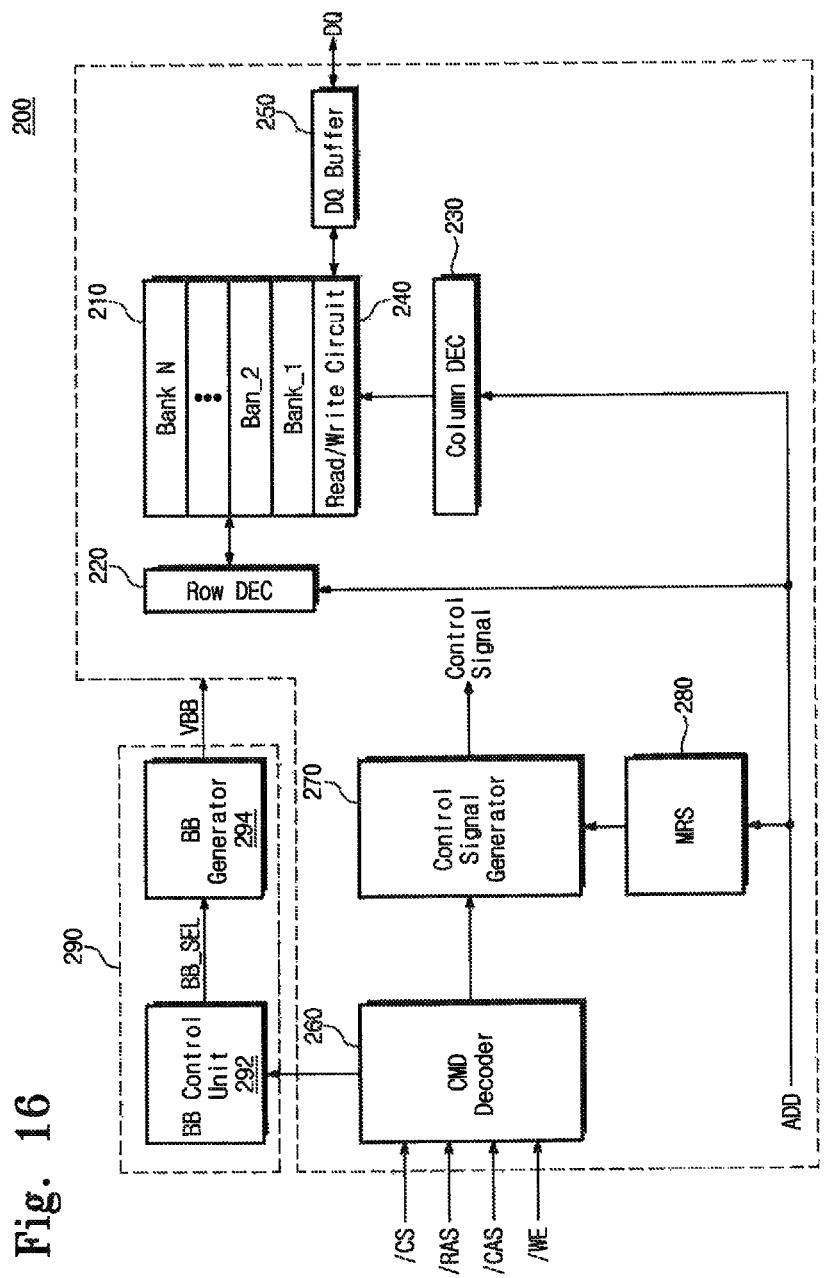
FIG. 16 is a block diagram of a body bias generator and a DRAM according to an embodiment of the inventive concept.

FIG. 16 is a block diagram schematically illustrating a DRAM according to an embodiment of the inventive concept. Referring to FIG. 16, a DRAM 200 may include a cell array 210, a row decoder 220, a column decoder 230, a read/write circuit 240, a DQ buffer 250, a command decoder 260, a control signal generator 270, a mode register set 280, and a body bias control unit 290.

The cell array 210 may include a plurality of memory cells which are connected with word lines and bit lines. Each memory cell may be formed of a cell capacitor and an access transistor. A gate of the access transistor may be connected with one of word lines arranged in a row direction. One end of the access transistor may be connected with a bit line or a complementary bit line arranged in a column direction. The other end of the access transistor may be connected with the cell capacitor.

The row decoder 220 may select a word line of a memory cell to be accessed in response to an input address. The row decoder 220 may decode the input address to enable a corresponding word line. Also, at a self-refresh mode of operation, the row decoder 220 may decode a row address generated from an address counter (not shown) to enable a corresponding word line. The column decoder 230 may select a bit line of a memory cell to be accessed.

The read/write circuit 240 may write data at a selected memory cell through a selected bit line or sense data from the selected memory cell through the selected bit line. The read/write circuit 240 may include a sense amplifier that senses and amplifies data stored at a memory cell and writes input data at a memory cell.

The DQ buffer 250 may temporarily store write data input from an external device to transfer it to the read/write circuit 240. The DQ buffer 250 may output read data transferred from the read/write circuit 240 to the external device.

The command decoder 260 may determine an input command based on control signals /CS, /RAC, /CAS, and /WE applied from the external device. In a typical DRAM, an active command and an auto refresh command may be decided by combination of the control signals /CS, /RAC, /CAS, and /WE. Also, a self-refresh command may be distinguished by combination of an auto refresh command and a clock enable signal CKE. A command decoding result may be transferred to the body bias control unit 290 and the control signal generator 270.

The control signal generator 270 may generate a control signal for accessing a selected memory cell based on commands CMD and a bank address input from the external device. The mode register set 280 may set an internal mod register in response to an MRS command for assigning a mode of operation of the DRAM 200 and an address signal.

The body bias control unit 290 may detect an input command to generate a body voltage VBB corresponding to each command. The body bias control unit 290 may include a body bias control unit 292 and a body bias generator 294. The body bias control unit 292 may detect an input command to generate a control signal BB_SEL. The body bias generator 294 may generate a body voltage VBB corresponding to a command based on the control signal BB_SEL. The body voltage VBB corresponding to a command may be applied to bodies of PMOS or NMOS transistors constituting all function blocks of the DRAM 200. The body voltage VBB may be controlled according to a mode of operation selected by a command to have various levels. At a command mode where the performance has the priority, the body voltage VBB having a relatively low level may be provided. On the other hand, at a power down mode where a decrease in power consumption has the priority, the body voltage VBB having a relatively high level may be provided.

Figure 17:
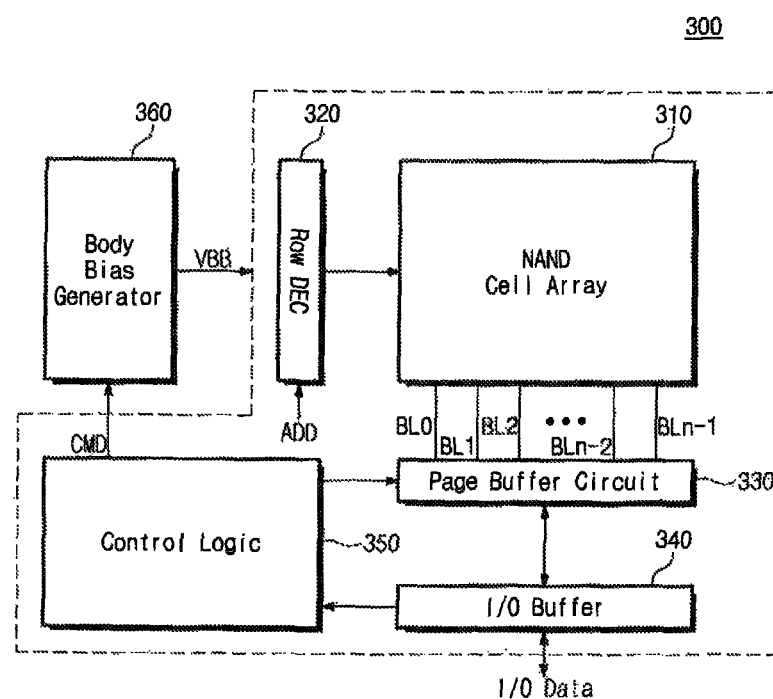
FIG. 17 is a block diagram of a body bias generator and a flash memory device according to an embodiment of the inventive concept.

FIG. 17 is a block diagram schematically illustrating a flash memory device according to an embodiment of the inventive concept. Referring to FIG. 17, a flash memory device 300 may include a NAND cell array 310, a row decoder 320, a page buffer circuit 330, an input/output buffer 340, control logic 350, and a body bias generator 360.

The NAND cell array 310 may be coupled with the row decoder 320 through word lines and selection lines. The NAND cell array 310 may be coupled with the page buffer circuit 330 through bit lines. The NAND cell array 310 may include a plurality of NAND cell strings. A channel of each NAND cell string may be formed in a horizontal or vertical direction. Word lines of the NAND cell array 310 may be stacked in a vertical direction.

The row decoder 320 may select one of the memory blocks of the NAND cell array 310 in response to an address ADD. The row decoder 320 may select one of word lines in the selected memory block. The row decoder 120 may transfer a word line voltage and a selection line voltage to the selected memory block.

The page buffer circuit 330 may operate as a write driver or a sense amplifier according to a mode of operation. At a read operation, the page buffer circuit 330 may sense data stored in a selected memory cell through a bit line under a control of the control logic 350. At a program operation, the page buffer circuit 330 may write data input through the input/output buffer 340 at the NAND cell array 310 through a bit line.

The input/output buffer 340 may temporarily store data provided from an external device. The input/output buffer 340 may temporarily store read data of the flash memory device 300 or internal status data to output them to the external device through an input/output line at a predetermined time. For example, the input/output buffer 340 may temporarily store a command, an address and data provided from the external device through the input/output line. The command may be transferred to the control logic 350, the address may be transferred to the row decoder 320 or the control logic 350, and the data may be transferred to the page buffer circuit 330.

The control logic 350 may control the page buffer circuit 330, the input/output butler 340, and the body bias generator 360 in response to a command transferred from the external device. The control logic 350 may respond to a read command to perform an overall control operation including word line setup, data sensing, a dumping operation, and a core recovery operation on selected memory cells.

The body bias generator 360 may generate a body voltage VBB applied to all circuits of the flash memory device 300 according to a control of the control logic 350. The body bias generator 360 may decide a level of the body voltage VBB based on a command directly provided from the control logic 350 or a decoded command.

At a mode where an operating speed has the priority, the body bias generator 360 may generate the body voltage VBB having a relatively low level. On the other hand, at a mode where a decrease in leakage current has the priority, the body bias generator 360 may generate the body voltage VBB having a relatively high level.

In the flash memory device 300 of the inventive concept, body voltage VBB is generated having various levels according to an operating command. Thus, the flash memory device 300 operates at low power consumption and high operating performance.

Figure 18:
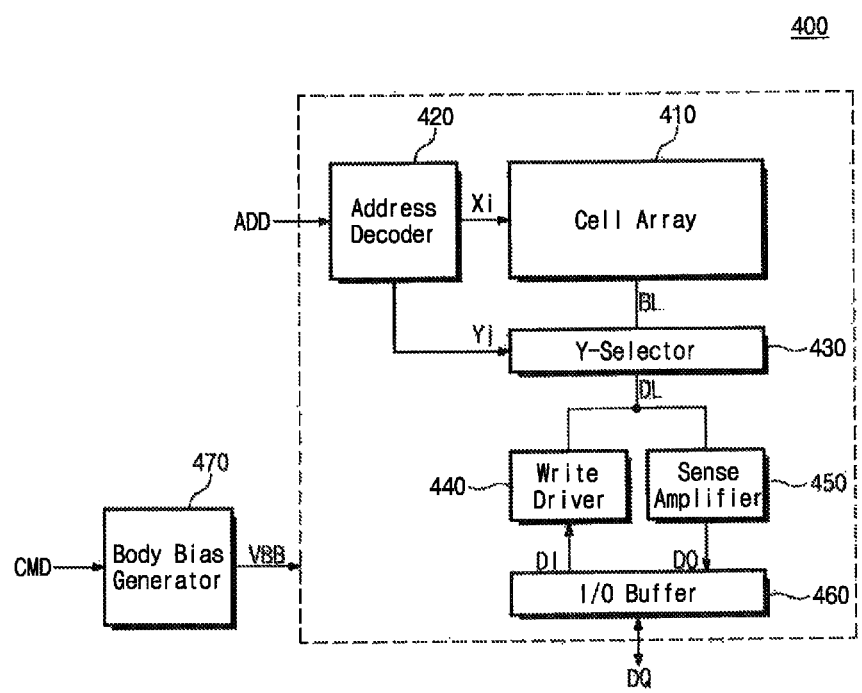
FIG. 18 is a block diagram of a body bias generator and a nonvolatile memory device according to another embodiment of the inventive concept.

FIG. 18 is a block diagram schematically illustrating a nonvolatile memory device according to another embodiment of the inventive concept. Referring to FIG. 18, a nonvolatile memory device 400 may include a cell array 410, an address decoder 420, a column selector 430, a write driver 440, a sense amplifier 450, an input/output buffer 460, and a body bias generator 470.

The cell array 410 may include a plurality of nonvolatile memory cells, each of which is a nonvolatile memory element capable of retaining data stored therein at power-off. For example, each memory cell may be formed of an MRAM, PRAM, RRAM or FRAM cell.

The address decoder 420 may receive an address ADD. Herein, the address ADD may be divided into a row address for selecting a word line and a column address for selecting a bit line. The address decoder 420 may decode the input address ADD to output selection signals Xi and Yi for selecting a word line and a bit line.

The column decoder 430 may select at least one of a plurality of bit lines in response to the selection signal Yi. The selected bit line may be connected with the write driver 440 or the sense amplifier 450.

The write driver 440 may receive input data DI transferred from the input/output buffer 460. The write driver 440 may transfer a write signal corresponding to the input data DI to a selected bit line through a data line DL. The sense amplifier 450 may sense data stored at a selected memory cell through a selected bit line. The sensed data may be transferred to the input/output buffer 460 as output data DO.

The input/output buffer 460 may store input data DI from an external device to transfer it to the write driver 440. The input/output buffer 460 may transfer output data DO from the sense amplifier 450 to the external device.

The body bias generator 470 may generate a body voltage VBB according to an externally provided command or an internally generated command. The body bias generator 470 may detect a command CMD to provide the body voltage VBB having various levels.

Figure 19:
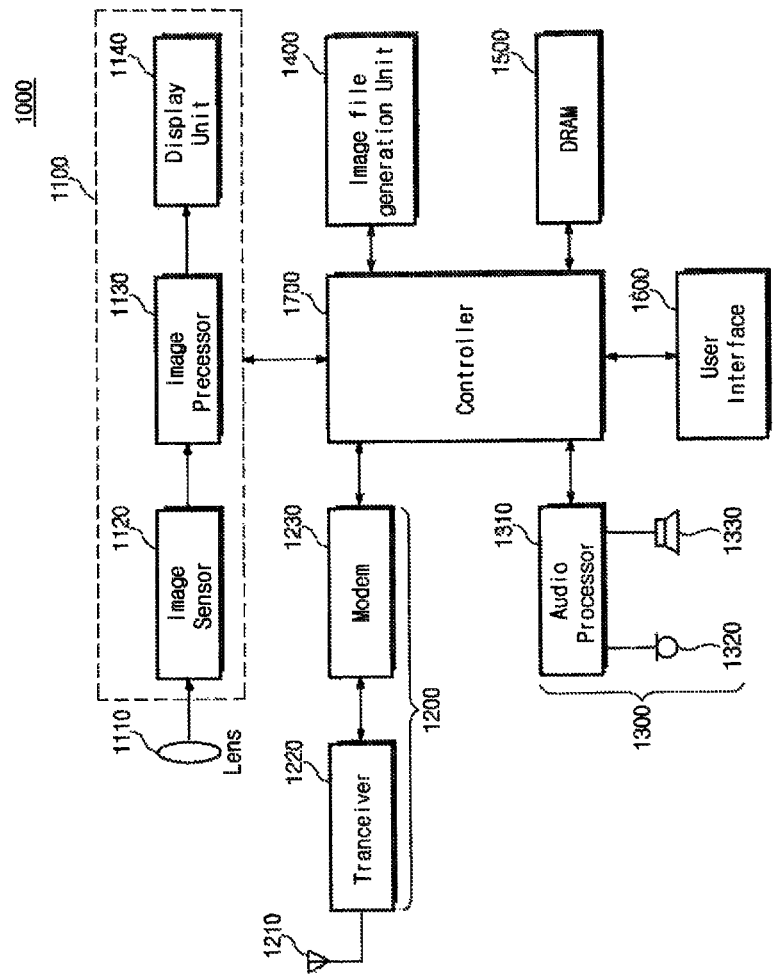
FIG. 19 is a block diagram of a handheld terminal employing a body bias generator according to an embodiment of the inventive concept.

With the nonvolatile memory device 400, it is possible to control a level of the body voltage VBB according to a command type. FIG. 19 is a block diagram schematically illustrating a handheld terminal according to an embodiment of the inventive concept.

Referring to FIG. 19, a handheld terminal 1000 may include an image processing block 1100, a wireless transceiver block 1200, an audio processing block 1300, an image file generation unit 1400, a DRAM 1500 of the inventive concept, a user interface 1600, and a controller 1700.

The image processing block 1100 may include an image sensor 1120, an image processor 1130, and a display unit 1140. The wireless transceiver block 1200 may include an antenna 1210, a transceiver 1220, and a modem 1230. The audio processing block 1300 may include an audio processor 1310, a microphone 1320, and a speaker 1330.

The handheld terminal 1000 may include various types of semiconductor devices. An application processor performing a function of the controller 1700 may require low power and high performance. The controller 1700 may have a multi-core structure according a scale-down process. If a body bias method of the inventive concept is employed, the amount of leakage current generated at the controller 1700 may be reduced. Herein, there is described an example in which the body bias method of the inventive concept is applied to the DRAM 1500 and the controller 1700. However, the inventive concept is not limited thereto. For example, a manner of controlling a body bias according to a command is applicable to chips included in the image processing block 1100, the wireless transceiver block 1200, the audio processing block 1300, and the image file generation unit 1400, and so on.

A semiconductor device may be packed by one selected from various types of packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System in Package (SIP), Multi Chip Package (MCP), Wafer-level Fabricated Package (WFP), Wafer-Level Processed Stack Package (WSP), and the like.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

The invention claimed is:
1. A semiconductor device, comprising:
a memory device having a plurality of transistors supplied with a first power supply voltage;
a body bias control unit configured to detect a command and to generate a body bias selection signal; and
a body bias voltage generator supplied with a second power supply voltage, the body bias voltage generator configured to generate a plurality of body bias voltages to body bias the plurality of transistors according to the body bias selection signal,
wherein the second power supply voltage is at a higher voltage level than the first power supply voltage,
wherein the second power supply voltage is at a higher voltage level than the plurality of body bias voltages, and
wherein various levels of body bias voltages are applied to PMOS types of the plurality of transistors according to the modes of operation, while a ground level of body bias voltage is applied to NMOS types of the plurality of transistors irrespective of mode of operation.
2. The semiconductor device of claim 1, wherein the second power supply voltage level is the same as or higher than the generated body bias voltages.

3. The semiconductor device of claim 1, wherein the body bias voltage generator includes a voltage down converter to generate the plurality of body bias voltages.
4. The semiconductor device of claim 3, wherein the voltage down converter is supplied with both the first power supply voltage and the second power supply voltage.
5. The semiconductor device of claim 1, wherein the plurality of body bias voltages comprises at least three different voltage levels.
6. A semiconductor device, comprising;
a memory device having a plurality of transistors supplied with a first power supply voltage; a body bias control unit configured to detect a command and to generate a body bias selection signal; and
a body bias voltage generator supplied with a second power supply voltage, the body bias voltage generator configured to generate a plurality of body bias voltages to body bias the plurality of transistors according to the body bias selection signal,
wherein the second power supply voltage is at a higher voltage level than the first power supply voltage,
wherein the command includes a power down mode and a self refresh mode, and the body bias voltage generated for the self refresh mode is higher than the body bias voltage level for the power down mode.
7. The semiconductor device of claim 1, wherein the command includes an active mode, a power down mode, and a self refresh mode, and the body bias voltage generated for the self refresh mode is equal to or lower than the second power supply voltage, and the body bias voltage generated for the active mode is less than the self refresh mode and the power down mode.
8. The semiconductor device of claim 1, wherein the body bias voltage generator includes a reference voltage generator configured to generate a plurality of reference voltages according to the body bias selection signal.
9. The semiconductor device of claim 8, wherein the reference voltage generator is configured to vary the reference voltages according to PVT variations.
10. The semiconductor device of claim 8, further including a current leakage monitor configured to monitor the amount of leakage current flow of the plurality of transistors and provide an offset based on the monitored leakage current to the reference voltage generator.
11. The semiconductor device of claim 8, wherein the body bias voltage generator is configured to change the levels of body bias voltages in response to different operation mode commands, wherein the change in body bias voltages is accomplished within 200 ns.
12. The semiconductor device of claim 1, wherein the memory device is a DRAM.
13. The semiconductor device of claim 1, wherein the memory device is a nonvolatile memory device.
14. The semiconductor device of claim 1, wherein the body bias voltage generator is supplied with the first power supply voltage in addition to the second power supply voltage.
15. The semiconductor device of claim 1, wherein the body bias voltage generator includes at least one comparator having an output connected to a transistor which in turn provides a body bias voltage without use of any capacitor for energy storage or discharge.
16. A method of operating a semiconductor device, comprising:
supplying a plurality of transistors with a first power supply voltage;
detecting a command to generate a body bias selection signal; and supplying a body bias voltage generator with a second power supply voltage and generating a plurality of body bias voltages to body bias the plurality of transistors according to the body bias selection signal, wherein the second power supply voltage is at a higher voltage level than the plurality of body bias voltages, and wherein various levels of body bias voltages are applied to PMOS types of the plurality of transistors according to the modes of operation, while a ground level of body bias voltage is applied to NMOS types of the plurality of transistors irrespective of mode of operation.

17. The method according to claim 16, wherein the second power supply voltage is at a higher voltage level than the first power supply voltage.

18. The method according to claim 16, wherein the second power supply voltage level is the same as or higher than the generated body bias voltages.

19. The method according to claim 16, wherein at least two of the plurality of body bias voltages are at a higher level than the first power supply voltage.

20. The method according to claim 16, wherein the body bias voltages are generated by a voltage down converter.

21. The method according to claim 20, wherein the voltage down converter is supplied with both the first power supply voltage and the second power supply voltage.

22. The method according to claim 16, wherein the second supply voltage is supplied by an external voltage source and the first supply voltage is generated internally at the semiconductor device.

23. The method according to claim 16, wherein the plurality of body bias voltages comprises at least three different voltage levels.

24. A method of operating a semiconductor device, comprising:
   supplying a plurality of transistors with a first power supply voltage; detecting a command to generate a body bias selection signal; and
   supplying a body bias voltage generator with a second power supply voltage and generating a plurality of body bias voltages to body bias the plurality of transistors according to the body bias selection signal,
   wherein the command includes a power down mode and a self refresh mode, and the body bias voltage generated for the self refresh mode is higher than the body bias voltage level for the power down mode.

25. The method according to claim 24, wherein at least two different body bias voltage levels are generated for the power down mode.

26. The method according to claim 16, wherein the command includes an active mode, a power down mode, and a self refresh mode, and the body bias voltage generated for the self refresh mode is equal to or lower than the second power supply voltage, and the body bias voltage generated for the active mode is less than the self refresh mode and the power down mode.

27. The method according to claim 16, wherein a plurality of reference voltages are generated according to the body bias selection signal.

28. The method according to claim 27, wherein the reference voltages generated are adjusted according to PVT variations.

29. The method according to claim 27, further including monitoring the amount of leakage current flow of the plurality of transistors and provide an offset to the generated reference voltages based on the monitored leakage current.

30. The method according to claim 16, including changing the levels of body bias voltages in response to different operation mode commands, wherein a change in levels of body bias voltages is accomplished within 200 ns.

31. The method according to claim 16, wherein the body bias voltage generator is supplied with the first power supply voltage in addition to the second power supply voltage.

32. The method according to claim 16, wherein the plurality of body bias voltages are generated without use of any capacitor for energy storage or discharge.

33. A handheld device, comprising:
   a processor;
   a display; and
   a semiconductor device, comprising:
      a memory device having a plurality of transistors supplied with a first power supply voltage;
      a body bias control unit configured to detect a command and to generate a body bias selection signal; and
      a body bias voltage generator supplied with a second power supply voltage, the body bias voltage generator configured to generate a plurality of body bias voltages to body bias the plurality of transistors according to the body bias selection signal,
      wherein the second power supply voltage is at a higher voltage level than the first power supply voltage,
      wherein the second power supply voltage is at a higher voltage level than the plurality of body bias voltages
      wherein various levels of boy bias voltages are applied to PMOS types of the plurality of transistors according to the modes of operation, while a ground level of body bias voltage is applied to NMOS types of the plurality of transistors irrespective of mode of operation.

34. The handheld device of claim 33, wherein the memory device is a DRAM.

35. The handheld device of claim 33, wherein the memory device is a nonvolatile memory device.

36. The handheld device of claim 33, further including a wireless transceiver and an audio processor.

* * * * *